(12) United States Patent
Han et al.

(10) Patent No.: US 10,497,450 B2
(45) Date of Patent: *Dec. 3, 2019

(54) MEMORY CARD

(71) Applicant: SAMSUNG ELECTRONICS CO., LTD., Suwon-si, Gyeonggi-Do (KR)

(72) Inventors: Seok-jae Han, Seongnam-si (KR); Il-mok Kang, Suwon-si (KR); Gwang-man Lim, Seoul (KR); Seok-heon Lee, Suwon-si (KR); Jae-bum Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/434,914

(22) Filed: Jun. 7, 2019

(65) Prior Publication Data

US 2019/0287630 A1  Sep. 19, 2019

Related U.S. Application Data

(63) Continuation of application No. 16/215,278, filed on Dec. 10, 2018, now Pat. No. 10,347,345, which is a continuation of application No. 15/989,070, filed on May 24, 2018, now Pat. No. 10,224,110, which is a continuation of application No. 14/824,061, filed on Aug. 11, 2015, now Pat. No. 10,157,678.

(30) Foreign Application Priority Data

Aug. 12, 2014 (KR) .................. 10-2014-0104542
Jul. 2, 2015 (KR) .................. 10-2015-0094934

(51) Int. Cl.
| | |
|---|---|
| *G11C 16/32* | (2006.01) |
| *G11C 16/30* | (2006.01) |
| *G06K 19/077* | (2006.01) |

(52) U.S. Cl.
CPC ........ *G11C 16/30* (2013.01); *G06K 19/07743* (2013.01)

(58) Field of Classification Search
CPC ...................................................... G11C 5/06
See application file for complete search history.

(56) References Cited

U.S. PATENT DOCUMENTS

| | | |
|---|---|---|
| 7,795,715 B2 | 9/2010 | Takiar et al. |
| 7,908,506 B2 | 3/2011 | Chien |
| 7,946,500 B2 | 5/2011 | Nishizawa et al. |

(Continued)

*Primary Examiner* — Hien N Nguyen
(74) *Attorney, Agent, or Firm* — Volentine, Whitt & Francos, PLLC

(57) ABSTRACT

A memory card is provided to include a substrate having two pairs of edges facing each other, a plurality of first row terminals that are arranged adjacent to an edge at an insertion side of the substrate and include a first voltage power terminal for applying a first voltage and a first ground terminal, a plurality of second row terminals that are spaced farther apart from the edge at the insertion side than the plurality of first row terminals and include a second voltage power terminal for applying a second voltage and first data terminals, and a plurality of third row terminals that are spaced farther apart from the edge at the insertion side than the plurality of second row terminals and include second data terminals.

20 Claims, 23 Drawing Sheets

(56) References Cited

U.S. PATENT DOCUMENTS

| | | |
|---|---|---|
| 8,110,434 B2 | 2/2012 | Okada et al. |
| 8,261,014 B2 | 9/2012 | Kang et al. |
| 8,296,491 B2 | 10/2012 | Pinto et al. |
| 10,224,110 B2 * | 3/2019 | Han ................. G06K 19/07743 |
| 2005/0281010 A1 | 12/2005 | Wang et al. |
| 2007/0257116 A1 | 11/2007 | Hsieh |
| 2007/0258220 A1 | 11/2007 | Chen et al. |
| 2008/0025003 A1 | 1/2008 | Nishizawa et al. |
| 2011/0145464 A1 | 6/2011 | Tan |
| 2011/0145465 A1 | 6/2011 | Okada |
| 2016/0049742 A1 | 2/2016 | Han et al. |
| 2018/0268911 A1 | 9/2018 | Han et al. |

* cited by examiner

MEMORY CARD

CROSS-REFERENCE TO RELATED APPLICATION

This is a Continuation of U.S. application Ser. No. 16/216,278, filed May 23, 2018, which is a Continuation of U.S. application Ser. No. 15/989,070, filed May 24, 2018, now U.S. Pat. No. 10,221,110, issued Mar. 5, 2019, which is a Continuation of U.S. application Ser. No. 14/824,061, filed Aug. 11, 2015, now U.S. Pat. No. 10,157,678, issued Dec. 18, 2018, which claims the benefit of Korean Patent Application Nos. 10-2015-0094934 and 10-2015-104542, filed Jul. 2, 2015 and Aug. 12, 2014, respectively, in the Korean Intellectual Property Office, the disclosure of which is incorporated herein in its entirety by reference.

BACKGROUND

The inventive concepts relate to a memory card, and more particularly, to a memory card that is operable at a high speed.

Because a memory card can easily store a large amount of data and because memory cards are easy to carry, memory cards are widely used in mobile phones and laptop computers. Memory cards may vary from each other in size according to necessity. Because the industry is demanding more compact, higher-speed, and higher-capacity memory cards, memory cards having smaller sizes, higher storage speeds, and greater storage capacities are continuously being developed and released. Meanwhile, as the requirements for memory cards used in electronic devices are increased, methods for providing memory cards having these increased requirements are being evaluated.

SUMMARY

The inventive concepts provide a memory card operable at a high speed.

The inventive concepts also provide a memory card that assists in preventing a malfunction.

The inventive concepts also provide an electronic system including an improved memory card.

According to an aspect of the inventive concepts, A memory card is provided. The memory card may include a substrate having two pairs of edges, in which the edges of each pair are arranged opposite to each other; a plurality of first row terminals that are arranged adjacent to an edge at an insertion side of the substrate and comprise a first voltage power terminal for applying a first voltage, a first ground terminal, and first data terminals; and a plurality of second row terminals that are spaced farther apart from the edge at the insertion side than the plurality of first row terminals and comprise a second voltage power terminal for applying a second voltage, and second data terminals, wherein a distance between a center of the second row terminals in a first direction (defined as the direction perpendicular to the edge at the insertion side) and a center of the memory card is approximately about 20% of a length of the memory card in the first direction, or less.

In one embodiment, the first data terminals may include a pair of first data input terminals and a pair of first data output terminals, and the second data terminals may comprise a pair of second data input terminals and a pair of second data output terminals.

In another embodiment, the first data input terminals and the first data output terminals may be spaced apart from each other with a ground terminal disposed therebetween. And the second data input terminals and the second data output terminals may be spaced apart from each other with a ground terminal disposed therebetween.

In another embodiment, the second row terminals may further include a card detection terminal disposed adjacent to the second voltage power terminal, wherein the card detection terminal is a grounded terminal.

In another embodiment, no terminal may be disposed between a front end of the card detection terminal and the edge at the insertion side.

In another embodiment, a distance between the edge at the insertion side and the front end of the card detection terminal may be equal to or shorter than a distance between the edge at the insertion side and a front end of the second voltage power terminal.

In another embodiment, a distance between the edge at the insertion side and a rear end of the card detection terminal may be equal to or greater than a distance between the edge at the insertion side and a rear end of the second voltage power terminal.

In another embodiment, the memory card may further include a memory controller and a non-volatile memory device, wherein the first voltage power terminal is configured to supply power to the non-volatile memory device, and the second voltage power terminal is configured to supply power to the memory controller.

In another embodiment, the memory controller may be connected to the first data input terminals and the first data output terminals via a first signal path through which data is transmitted and received, and may be connected to the second data input terminals and the second data output terminals via a second signal path through which data is transmitted and received.

According to another aspect of the inventive concepts, a memory card is provided. The memory card may include a substrate having two pairs of edges, in which the edges of each pair are arranged opposite to each other; a plurality of first row terminals that are arranged adjacent to an edge at an insertion side of the substrate and comprise a first voltage power terminal for applying a first voltage, and a first ground terminal; a plurality of second row terminals that are spaced farther apart from the edge at the insertion side than the plurality of first row terminals and comprise a second voltage power terminal for applying a second voltage, and first data terminals; and a plurality of third row terminals that are spaced farther apart from the edge at the insertion side than the plurality of second row terminals and comprise second data terminals, wherein a distance between a center of the second row terminals in a first direction (i.e., a direction substantially perpendicular to the edge at the insertion side) and a center of the memory card is approximately about 20% of a length of the memory card in the first direction, or less.

In one embodiment, the first data terminals may include a pair of first data input terminals and a pair of first data output terminals, and the second data terminals may include a pair of second data input terminals and a pair of second data output terminals.

In another embodiment, the second row terminals may further include a card detection terminal disposed adjacent to the second voltage power terminal, wherein the card detection terminal is a grounded terminal.

In another embodiment, the first data input terminals may be shielded by a pair of ground terminals, the first data output terminals may be shielded by a pair of ground terminals, the second data input terminals may be shielded by a pair of ground terminals, and the second data output terminals may be shielded by a pair of ground terminals.

In another embodiment, the second row terminals and the third row terminals may have common extension ground terminals extending over the second row and the third row in the first direction.

In another embodiment, the card detection terminal may extend over the second row and the third row in the first direction, and the second row terminals and the third row terminals may have common extension ground terminals extending over the second row and the third row in the first direction.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EXEMPLARY EMBODIMENTS

Figure 1:
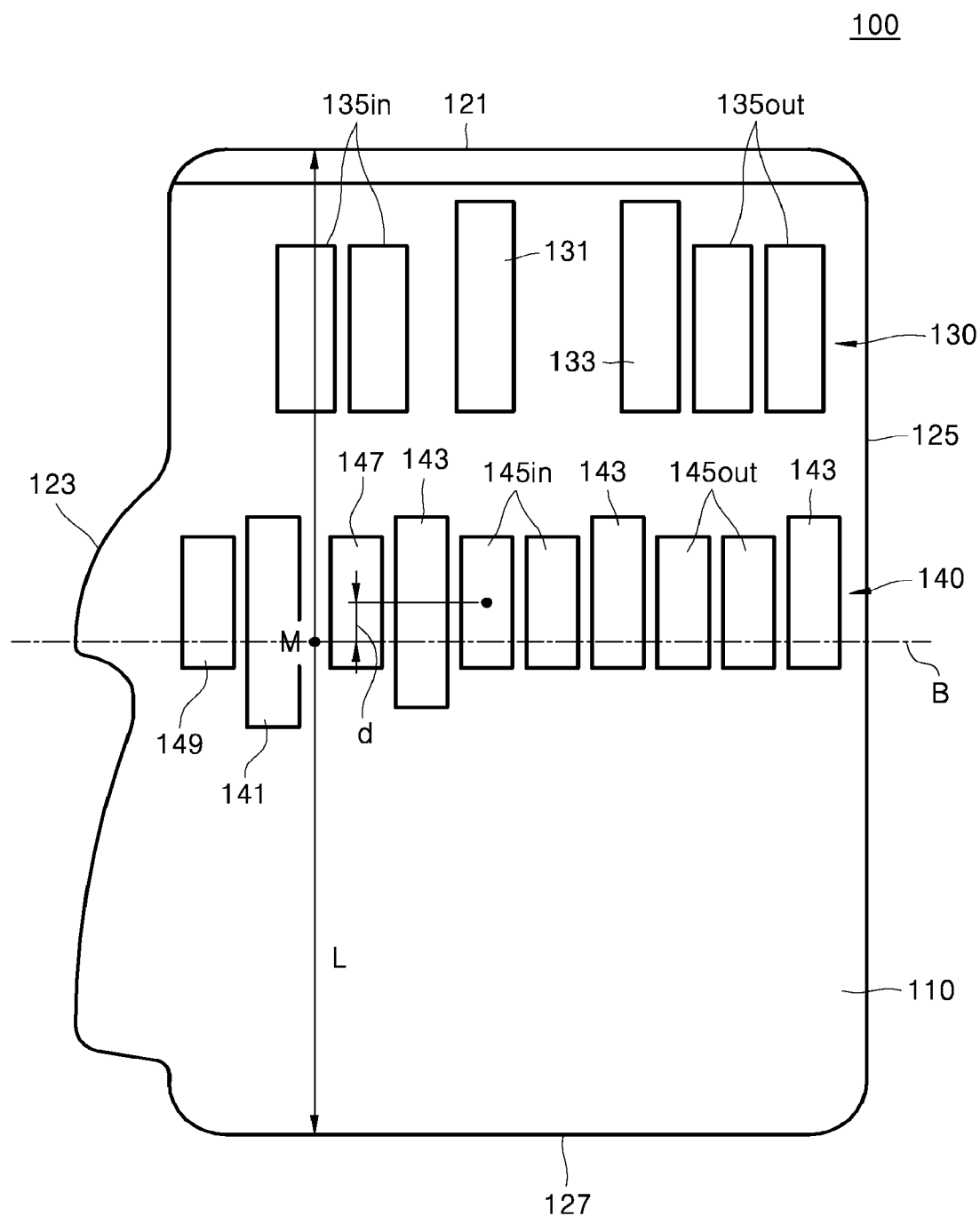
FIG. 1 is a plan view illustrating a memory card according to an exemplary embodiment of the inventive concepts.

The inventive concepts will now be described more fully with reference to the accompanying drawings, in which exemplary embodiments of the inventive concepts are shown. The inventive concepts may, however, be embodied in many different forms, and should not be construed as being limited to the exemplary embodiments set forth herein. Rather, these embodiments are provided so that this disclosure will be thorough and complete, and will fully convey the scope of the inventive concepts to those skilled in the art. Like reference numerals denote like elements throughout the specification. Furthermore, various elements and regions are schematically illustrated in the drawings. Thus, the inventive concepts are not limited by the relative sizes or intervals illustrated in the attached drawings.

Terms including ordinal numbers such as 'first', 'second', etc. are used to describe various elements, but the elements should not be limited by these terms. The terms are used only for distinguishing one element from another element. For example, without departing from the spirit and scope of the inventive concepts, a first component may be referred to as a second component, or a second component may be referred to as a first component.

The terms used in the present specification are merely used to describe particular embodiments, and are not intended to limit the inventive concepts. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, but are not intended to preclude the possibility that one or more other features, numbers, steps, actions, components, parts, or combinations thereof may exist or may be added.

Unless defined differently, all terms used in the description including technical and scientific terms have the same meanings as generally understood by those skilled in the art. Terms commonly used and defined in dictionaries should be construed as having the same meanings as in the associated technical context of the inventive concepts, and unless clearly defined with a specific meaning in the description, these terms should not be construed as having overly formal meanings.

As used herein, the term "and/or" includes any and all combinations of one or more of the associated listed items. Expressions such as "at least one of," when preceding a list of elements, modify the entire list of elements and do not modify the individual elements of the list.

Figure 2:
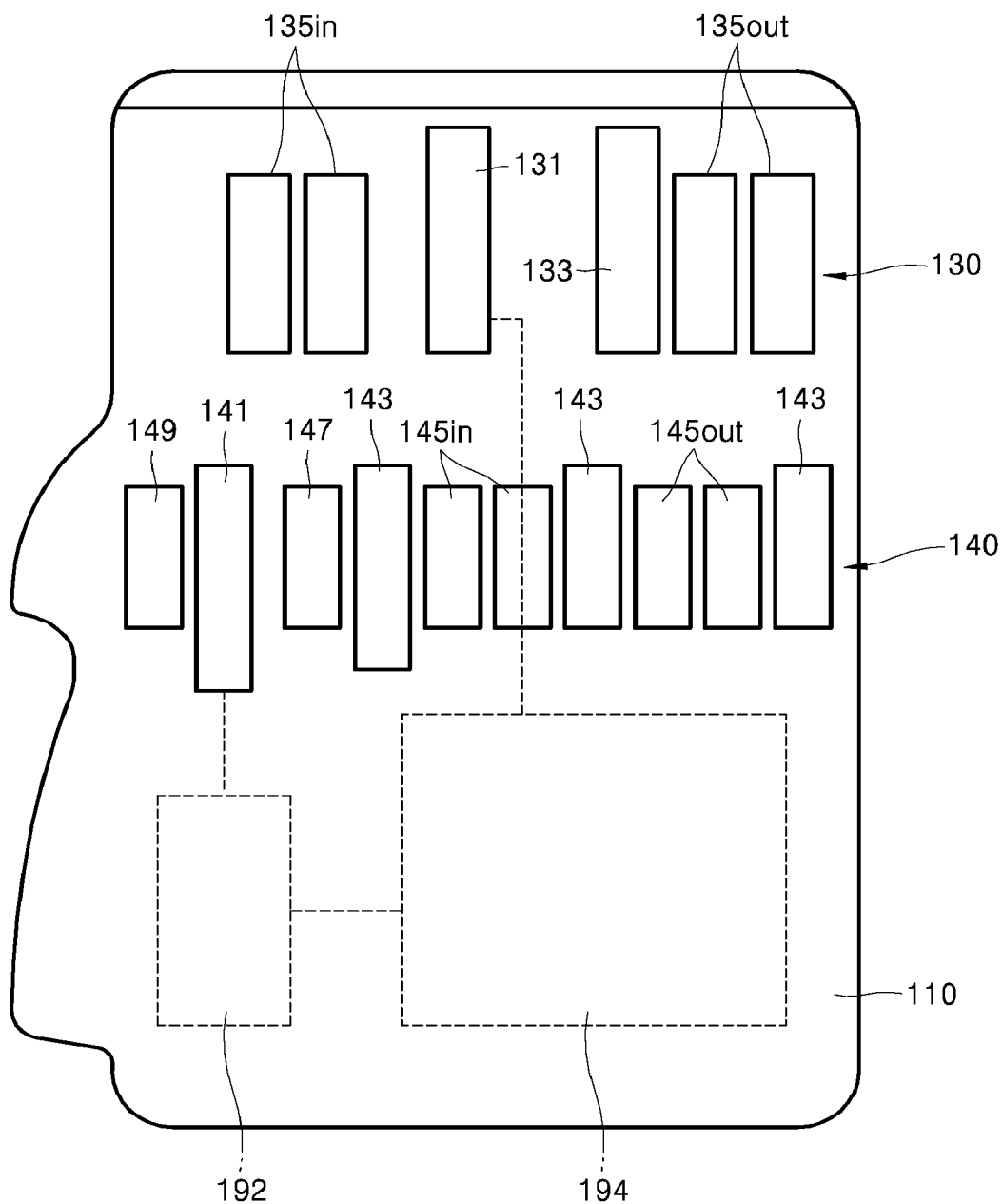
FIG. 2 is a partial perspective view illustrating a memory card and some of internal components of the memory card according to an exemplary embodiment of the inventive concepts.

FIG. 1 is a plan view illustrating a memory card 100 according to an exemplary embodiment of the inventive concepts. FIG. 2 is a partial perspective view illustrating the memory card 100 and some of the internal components of the memory card 100 according to an exemplary embodiment of the inventive concepts.

Referring to FIG. 1, the memory card 100 may have two pairs of edges, in which the edges of each pair are arranged opposite to each other. The edges may include an edge 121 (i.e., an insertion edge) at an insertion side where the memory card 100 is inserted into a socket, a first edge 123 and a second edge 125 that adjoin the edge 121 at the insertion side, and a third edge 127 opposite the edge 121 at the insertion side. The insertion edge 121 and the third edge 127 may therefore provide one of the two pairs of edges, and the first edge 123 and second edge 125 may form the other. The edge 121 at the insertion side and the third edge 127 may be substantially parallel to each other. A first direction refers herein to a direction substantially perpendicular to the edge 121 at the insertion side.

Referring to FIG. 2, the memory card 100 may include a memory controller 192 and a non-volatile memory device 194. While only one non-volatile memory device 194 is illustrated on the memory card 100 shown in FIG. 2, two or more non-volatile memory devices may be mounted thereon.

Referring to FIG. 1, a substrate 110 may include a plurality of first row terminals 130 that are arranged adjacent to the insertion edge 121 and a plurality of second row terminals 140 that are spaced apart from the first row terminals 130 farther from the insertion edge 121.

The first row terminals 130 may include a first voltage power terminal 131, first data terminals 135in and 135out, and at least one ground terminal. The first data terminals 135in and 135out may include a pair of first data input terminals 135in and a pair of first data output terminals 135out.

The second row terminals 140 may include a second voltage power terminal 141, second data terminals 145in and 145out, a reference clock terminal 147, a card detection terminal 149, and at least one ground terminal. The second data terminals 145in and 145out may include a pair of second data input terminals 145in and a pair of second data output terminals 145out.

The first row terminals 130 may include the first voltage power terminal 131 for applying a first voltage. The first voltage may, for example, be approximately between about 3.0 V and about 3.5 V. The first voltage may be supplied to semiconductor devices that operate at a low speed among semiconductor devices in the memory card 100. For example, the first voltage may be supplied to the non-volatile memory device 194 in the memory card 100.

The second row terminals 140 may include the second voltage power terminal 141 for applying a second voltage. The second voltage may, for example, be approximately between about 1.5 V and about 2.2 V. The second voltage may be supplied to semiconductor devices that operate at a high speed among semiconductor devices in the memory card 100. For example, the second voltage may be supplied to the memory controller 192 in the memory card 100.

Because the first row terminals 130 are closer to the edge 121 at the insertion side than are the second row terminals 140, power may be supplied to the first row terminals 130 before being supplied to the second row terminals 140 when the memory card 100 is inserted. In other words, as the memory card 100 is inserted, power of the first voltage may be supplied to the non-volatile memory device 194 before the card is fully inserted via the first voltage power terminal 131 included in the first row terminals 130. Accordingly, the first row terminals 130 may also be provided with at least one ground terminal, and a first ground terminal 133 may also be connected to a host during insertion (along with the first voltage power terminal 131) so as to form a complete power and ground circuit. By including a ground terminal 133 along with a power terminal 131, the entire memory card 100 may be operated during insertion of the memory card 100, before power is even supplied to the memory controller 192, so that an overall operation of the memory card 100 can be prepared.

A distance between a front end of the first voltage power terminal 131 and the insertion edge 121 may be substantially the same as a distance between a front end of the first ground terminal 133 and the insertion edge 121. A length of the first voltage power terminal 131 in the first direction may also be substantially the same as a length of the first ground terminal 133 in the first direction.

In embodiments of the inventive concepts, a front end may refer to the one of the two ends of an element that is closer to the insertion edge 121 than the other, and a rear end may refer to the one of the two ends of the element that is farther from the insertion edge 121 than the other.

A distance between the front end of the first voltage power terminal 131 and the insertion edge 121 (and between the front end of the first ground terminal 133 and the insertion edge 121) may be smaller than a distance between front ends of the first data input terminals 135in and first data output terminals 135out and the insertion edge 121. When the memory card 100 is inserted into a socket, the entire memory card 100 may be driven prior to signal transmission with respect to a host by allowing each of the first voltage power terminal 131 and the first ground terminal 133 to contact a socket pin before other terminals of the first row terminals 130 (such as the first data input terminals 135in and the first data output terminals 135out) contact socket pins.

The first data input terminals 135in and the first data output terminals 135out may be spaced apart from each other with a ground terminal included therebetween. According to an exemplary embodiment, the first data input terminals 135in and the first data output terminals 135out may be spaced apart from each other with the first ground terminal 133 included therebetween, thereby preventing signal interference that may otherwise result from noise between the first data input terminals 135in and the first data output terminals 135out.

One pair of first data input terminals 135in may have substantially identical dimensions, and one pair of first data output terminals 135out may have substantially identical dimensions. In addition, the first data input terminals 135in and the first data output terminals 135out may have substantially identical dimensions.

A length of the first data input terminals 135in and the first data output terminals 135out in the first direction may be shorter than a length of the first ground terminal 133 in the first direction.

The front end of the first ground terminal 133 may be closer to the edge 121 at the insertion side than the front ends of the first data input terminals 135in and the first data output terminals 135out.

A distance between a rear end of the first ground terminal 133 and the edge 121 at the insertion side may be greater than or equal to a distance between rear ends of the first data input terminals 135in and the first data output terminals 135out and the edge 121 at the insertion side.

Furthermore, a location range of the first data input terminals 135in and the first data output terminals 135out in the first direction may be within a location range of the first ground terminal 133 in the first direction.

The first data input terminals 135in and the first data output terminals 135out may be spaced apart from each other with the first voltage power terminal 131 and the first ground terminal 133 included therebetween.

Also, among the first data input terminals 135in and the first data output terminals 135out, a pair of terminals that are adjacent to the first voltage power terminal 131 may be spaced apart from the first voltage power terminal 131 by a predetermined distance. For example, the pair of terminals adjacent to the first voltage power terminal 131 may be spaced apart from the first voltage power terminal 131 by a distance of approximately about 50% to about 150% of a width of the front end of the first voltage power terminal 131. Here, the width of the front end of the first voltage power terminal 131 is defined as a width of the first voltage power terminal 131 in a direction substantially perpendicular to the first direction.

The second row terminals 140 may be disposed in or near a central portion of the memory card 100. A distance between the second row terminals 140 and the memory controller 192 and a distance between the second row terminals 140 and the non-volatile memory device 194 may thereby be reduced, and routing may be simplified. Thus, a high operational speed may be achieved and a circuit design may be more easily facilitated. For example, when the second row terminals 140 are disposed in or near the central portion of the memory card 100, routing may be readily provided by using a via hole passing through first and second surfaces of the substrate 110 in a region between the second row terminals 140 and the third edge 127, and thus, manufacturing time and costs may be reduced.

In particular, power supplied to a semiconductor device operating at a high speed, may be supplied to the memory controller 192 via the second voltage power terminal 141. Because the second row terminals 140, in which the second voltage power terminal 141 is included, are disposed in or near the central portion of the memory card 100, a path via which power is supplied to the memory controller 192 may be minimized. This may be advantageous for a high-speed operation. Also, regardless of which portion of the memory card 100 the memory controller 192 is disposed in, a relatively small distance between the memory controller 192 and the second voltage power terminal 141 may be maintained which may facilitate convenience in terms of design.

In some embodiments, the second row terminals 140 may be arranged to be spaced apart from the first row terminals 130 and be farther away from the edge 121 at the insertion side. The second row terminals 130 may be arranged along an axis B that is substantially parallel to the insertion edge 121 and passes through a middle point M of a length of the memory card (i.e., a center M of the memory card in the lengthwise direction). The length of the memory card may refer to the length in the first direction. In some embodiments, the second row terminals 140 may have various lengths in the first direction. However, a center of one of the second data terminals may be arranged adjacent to the axis B. In one embodiment, the center of one of second data terminals may be arranged adjacent to but spaced apart from the axis B toward the insertion edge 121. In another embodiment, the center of one of the second data terminals may be arranged adjacent to but spaced apart from the axis B toward the opposite edge 127.

In some embodiments, a distance d in the first direction between a center of the second row terminals 140 and a center M of the memory card 100 may be approximately about 20% or less of a length L of the memory card 100 in the first direction. The second row terminals 140 may have various lengths in the first direction, and moreover, positions of the front ends and the rear ends of the respective terminals may not be regular. Here, the center of the second row terminals 140 may be defined by a center of a terminal, among the second data input terminals 145in and the second data output terminals 145out, that is closest to the edge 121 at the insertion side.

Therefore, regardless of where the memory controller 192 and the non-volatile memory devices 194 are disposed, a distance between the memory controller 192 and the non-volatile memory devices 194 and the second data input terminals 145in and the second data output terminals 145out may be minimized, thereby allowing a high speed operation and providing a degree of freedom in terms of design.

The second row terminals 140 may include a pair of second data input terminals 145in and a pair of second data output terminals 145out. While the second data input terminals 145in are illustrated as being disposed closer to the center of the memory card 100 than the second data output terminals 145out in FIG. 2, positions of the second data input terminals 145in and the second data output terminals 145out may be changed.

A pair of second data input terminals 145in may have substantially identical dimensions, and a pair of second data output terminals 145out may have substantially identical dimensions. Also, the second data input terminals 145in and the second data output terminals 145out may have substantially identical dimensions.

A length in the first direction of the second data input terminals 145in and the second data output terminals 145out may be shorter than a length in the first direction of ground terminals 143 included in a second row.

Front ends of the ground terminals 143 included in the second row may be closer to the edge 121 at the insertion side than the front ends of the second data input terminals 145in and the second data output terminals 145out.

A distance between rear ends of the ground terminals 143 included in the second row and the edge 121 at the insertion side may be greater than or equal to a distance between the rear ends of the second data input terminals 145in and the second data output terminals 145out and the edge 121 at the insertion side.

Furthermore, a location range in the first direction of the second data input terminals 145in and the second data output terminals 145out may be within a location range in the first direction of the ground terminals 143 included in the second row.

The second data input terminals 145in and the second data output terminals 145out may be spaced apart from each other with ground terminals included therebetween. The ground terminals may prevent signal noise between the second data input terminals 145in and the second data output terminals 145out.

The second row terminals 140 may include at least one ground terminal. The second data input terminals 145in may be disposed between a pair of ground terminals so as to be shielded. The second data output terminals 145out may also be disposed between a pair of ground terminals so as to be shielded. The second data input terminals 145in and the second data output terminals 145out may therefore each be shielded by a pair of ground terminals to facilitate the stable inputting or outputting of data.

In some embodiments, the second data input terminals 145in and the second data output terminals 145out may be spaced apart from each other with a ground terminal included therebetween, and all of the second data input terminals 145in and second data output terminals 145out may be disposed between a pair of ground terminals. In other words, while the second data input terminals 145in are shielded by a pair of ground terminals and the second data output terminals 145out are shielded by a pair of ground terminals, the second data input terminals 145in and the second data output terminals 145out have a common ground terminal. However, the second data input terminals 145in and the second data output terminals 145out may also be shielded without a common ground terminal therebetween.

Examples of ground terminals that may be used to shield the second data input terminals 145in and the second data output terminals 145out may, for example, include the card detection terminal 149, which is a grounded terminal.

The front ends of the second voltage power terminal 141 and the ground terminals 143 included in the second row may be disposed to be closer to the insertion edge 121 than the front ends of the second data input terminals 145in and the second data output terminals 145out. When the memory card 100 is inserted into a socket, the second voltage power terminal 141 and the ground terminals 143 included in the second row contact a socket pin before other terminals of the second row terminals 140 (such as the second data input terminals 145in and the second data output terminals 145out) so that a power and ground circuit that drive the memory controller 192 can be completed prior to signal transmission with respect to a host.

A distance between the front end of the second voltage power terminal 141 and the edge 121 at the insertion side may be substantially the same as a distance between the front ends of the ground terminals 143 included in the second row and the edge 121 at the insertion side. A length in the first direction of the second voltage power terminal 141 in the first direction may be substantially the same as a length of the ground terminals 143 included in the second row.

The second row terminals 140 may include a reference clock terminal 147. A distance between the reference clock terminal 147 and the memory controller 192 may be minimized for a high speed operation. A position of the memory controller 192 may be varied according to a design of the memory card 100, and thus, reference clock terminal 147 may be preferably disposed as close to the center of the memory card 100 as possible. In this regard, the reference clock terminal 147 may be disposed closer to the center of the memory card 100 than the card detection terminal 149 or the second voltage power terminal 141.

Also, the second row terminals 140 may be spaced apart from the second data input terminals 145in and the second data output terminals 145out with a ground terminal included therebetween. The reference clock terminal 147 may be spaced apart from the second data input terminals 145in and the second data output terminals 145out with a ground terminal included therebetween. In this manner, an influence of noise that may be caused due to signal input and output may be minimized, thereby enabling a more stable operation of the memory card 100.

The second row terminals 140 may include the card detection terminal 149. The card detection terminal 149 may be disposed adjacent to the second voltage power terminal 141. While the card detection terminal 149 is disposed closest to the first edge 123 among the second row terminals 140, and the second voltage power terminal 141 is disposed along a lateral direction of the card detection terminal 149, positions of the card detection terminal 149 and the second voltage power terminal 141 may be exchanged.

The card detection terminal 149 allows a host to determine a type of the memory card 100. The card detection terminal 149 may be a grounded terminal that is electrically connected to a ground line.

By using a grounded terminal as the card detection terminal 149 (rather than data input and output terminals) and by allowing a host to receive a ground signal from a socket terminal at a position of the card detection terminal 149 so as to determine a card type, accuracy in terms of recognition of card types can be remarkably increased. Accordingly, recognition error can be reduced, and moreover, a data input and output process for recognizing a card type may be omitted, thereby increasing a recognition speed.

Positions of the front end of the second voltage power terminal 141 and the front end of the card detection terminal 149 may be different from each other. As illustrated in FIG. 1, the front end of the second voltage power terminal 141 may be closer to the insertion edge 121 than is the front end of the card detection terminal 149.

When host socket pins for contacting the second row terminals 140 are arranged in parallel in a horizontal direction (perpendicular to the first direction), the second voltage power terminal 141 (having a front end closer to the insertion edge 121) contacts the socket pins before the card detection terminal 149 when the memory card 100 is inserted. As a result, power may be supplied to the memory controller 192 in advance, and the memory card 100 may be operated in advance, before the host recognizes a type of the memory card 100.

According to principles of the present inventive concepts, however, no terminal may be disposed between the front end of the card detection terminal 149 and the insertion edge 121. In other words, none of the first row terminals 130 are disposed between the front end of the card detection terminal 149 and the insertion edge 121. Accordingly, when the memory card 100 is inserted, a socket pin corresponding to the card detection terminal 149 will not erroneously contact other terminals of the memory card 100, and thus, an error whereby the host recognizes a wrong type of card may be prevented from occurring.

Figure 3:
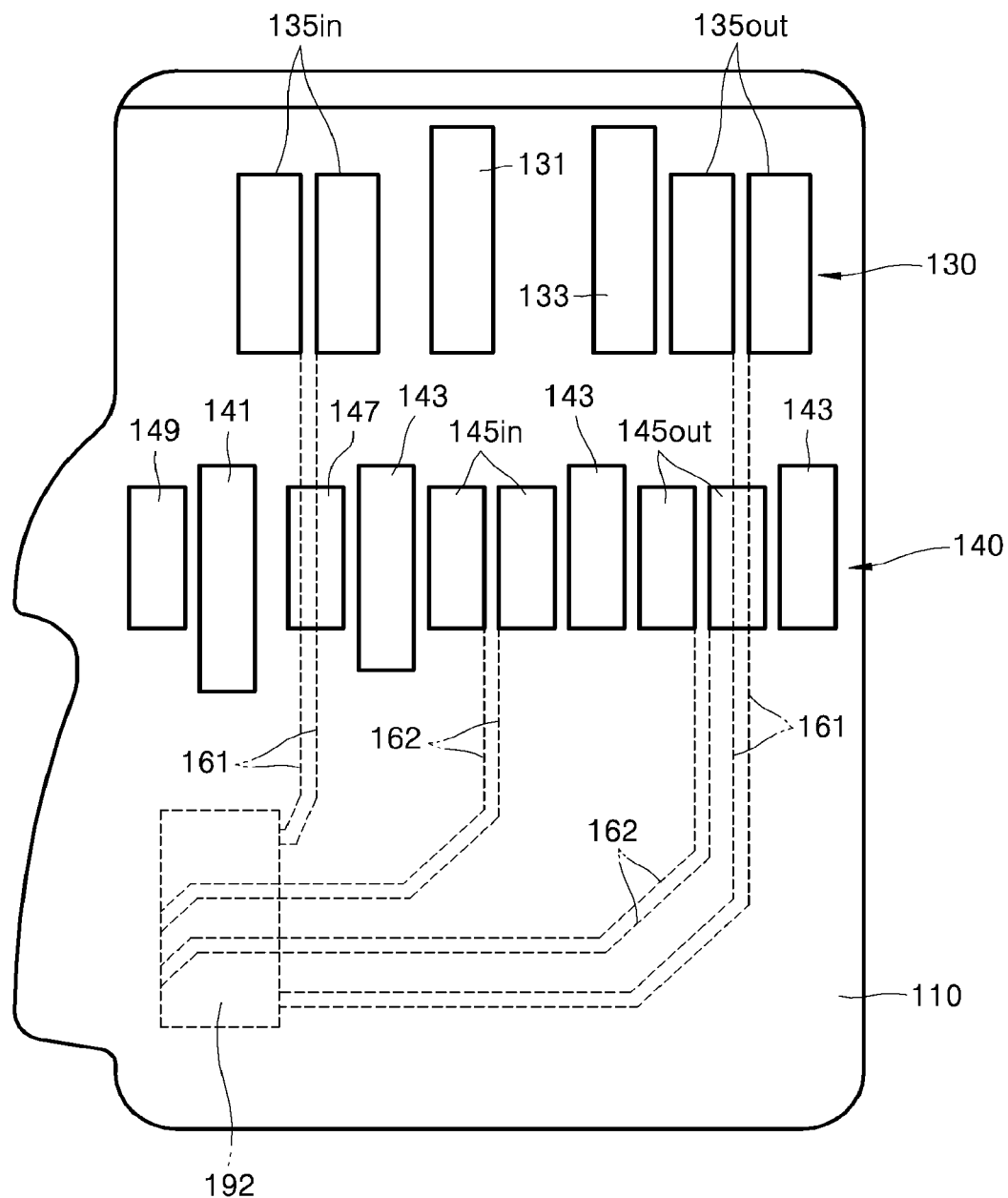
FIG. 3 is a partial perspective view illustrating a memory controller in a memory card according to an exemplary embodiment of the inventive concepts.

FIG. 3 is a partial perspective view illustrating the memory controller 192 in the memory card 100 according to an exemplary embodiment of the inventive concepts.

Referring to FIG. 3, the memory controller 192 is connected to the first data input terminals 135in and the first data output terminals 135out via a first signal path 161 through which data is transmitted and received, and is connected to the second data input terminals 145in and the second data output terminals 145out via a second signal path 162 through which data is transmitted and received.

The memory controller 192 may transmit and receive an electrical signal to and from a host or an external device via the first signal path 161 and the second signal path 162. The first signal path 161 and the second signal path 162 may be formed on a second surface opposite a first surface of the substrate 110 on which the first row terminals 130 are formed.

Figure 4:
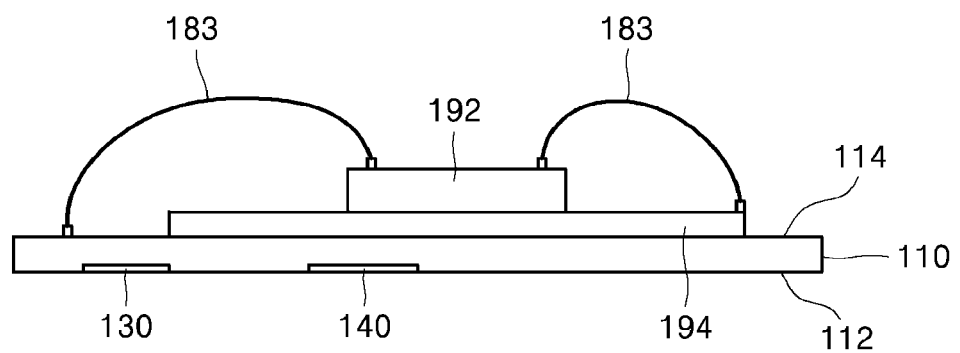
FIG. 4 is a schematic cross-sectional view illustrating a memory card according to an exemplary embodiment of the inventive concepts.

FIG. 4 is a schematic cross-sectional view illustrating the memory card 100 according to an exemplary embodiment of the inventive concepts.

Referring to FIG. 4, the plurality of first row terminals 130 and the plurality of second row terminals 140 may be disposed on a first surface 112 of the substrate 110. In addition, the non-volatile memory device 194 and the memory controller 192 may be disposed on a second surface 114 of the substrate 110 opposite the first surface of the substrate 110. However, positions, sizes, and correlation between the elements are exemplary.

The memory controller 192 may be electrically connected to the first row terminals 130 and the second row terminals 140. For example, the memory controller 192 may be electrically connected to the first row terminals 130 and the second row terminals 140 via a wire 183, wiring formed on the first and second surfaces of the substrate 110, or a wiring layer or a through via formed inside the substrate 110.

Also, the memory controller 192 may be electrically connected to the non-volatile memory device 194. For example, the memory controller 192 may be electrically connected to the non-volatile memory device 194 via the wire 183.

FIGS. 5A through 5E are plan views illustrating the memory card 100 according to exemplary embodiments of the inventive concepts.

Referring to FIGS. 5A through 5E, a length and a position of the card detection terminal 149 in the first direction may be modified as described below.

A distance between the front end of the card detection terminal 149 and the insertion edge 121 may be equal to or shorter than a distance between the front end of the second voltage power terminal 141 and the insertion edge 121, so that the host may recognize a card at the same time as or before the memory controller 192 is driven.

A distance between a rear end of the card detection terminal 149 and the edge 121 at the insertion side may be equal to or greater than a distance between the rear end of the second voltage power terminal 141 and the insertion edge 121, so that overtravel, which refers to deviation of the card detection terminal 149 from a corresponding socket pin when it is completely inserted, may be minimized.

Figure 5A:
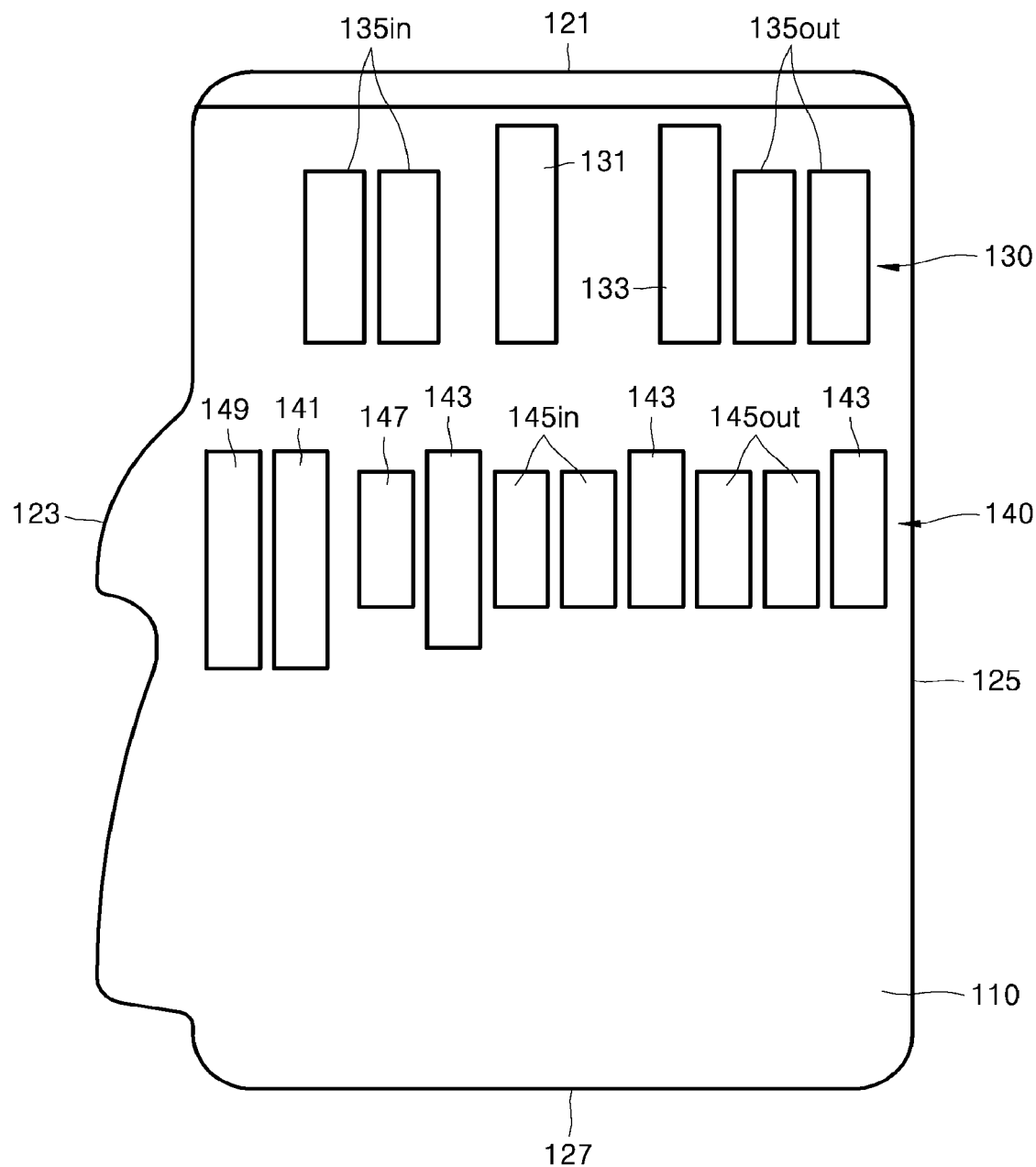
FIGS. 5A through 5E are plan views illustrating a memory card according to an exemplary embodiment of the inventive concepts.

Referring to FIG. 5A, lengths in the first direction of the second voltage power terminal 141 and the card detection terminal 149 may be substantially identical. Also, positions of the front ends of the second voltage power terminal 141 and the card detection terminal 149 at the edge 121 at the insertion side are substantially the same. In other words, a distance between the edge 121 at the insertion side and the front end of the card detection terminal 149 may be substantially the same as a distance between the edge 121 at the insertion side and the front end of the second voltage power terminal 141.

When the second voltage power terminal 141 and the card detection terminal 149 are configured as illustrated in FIG. 5A, the second voltage power terminal 141 and the card detection terminal 149 may substantially simultaneously contact socket terminals, and the card detection terminal 149 (which is a ground terminal) and the ground terminals 143 included in the second row may substantially simultaneously contact the socket terminals. Mutual interference between terminals due to noise may therefore be minimized. Furthermore, as the rear end of the card detection terminal 149 is withdrawn to a position of the rear end of the second voltage power terminal 141, overtravel, which refers to deviation of the card detection terminal 149 from a corresponding position of a socket pin, may be minimized.

Figure 5B:
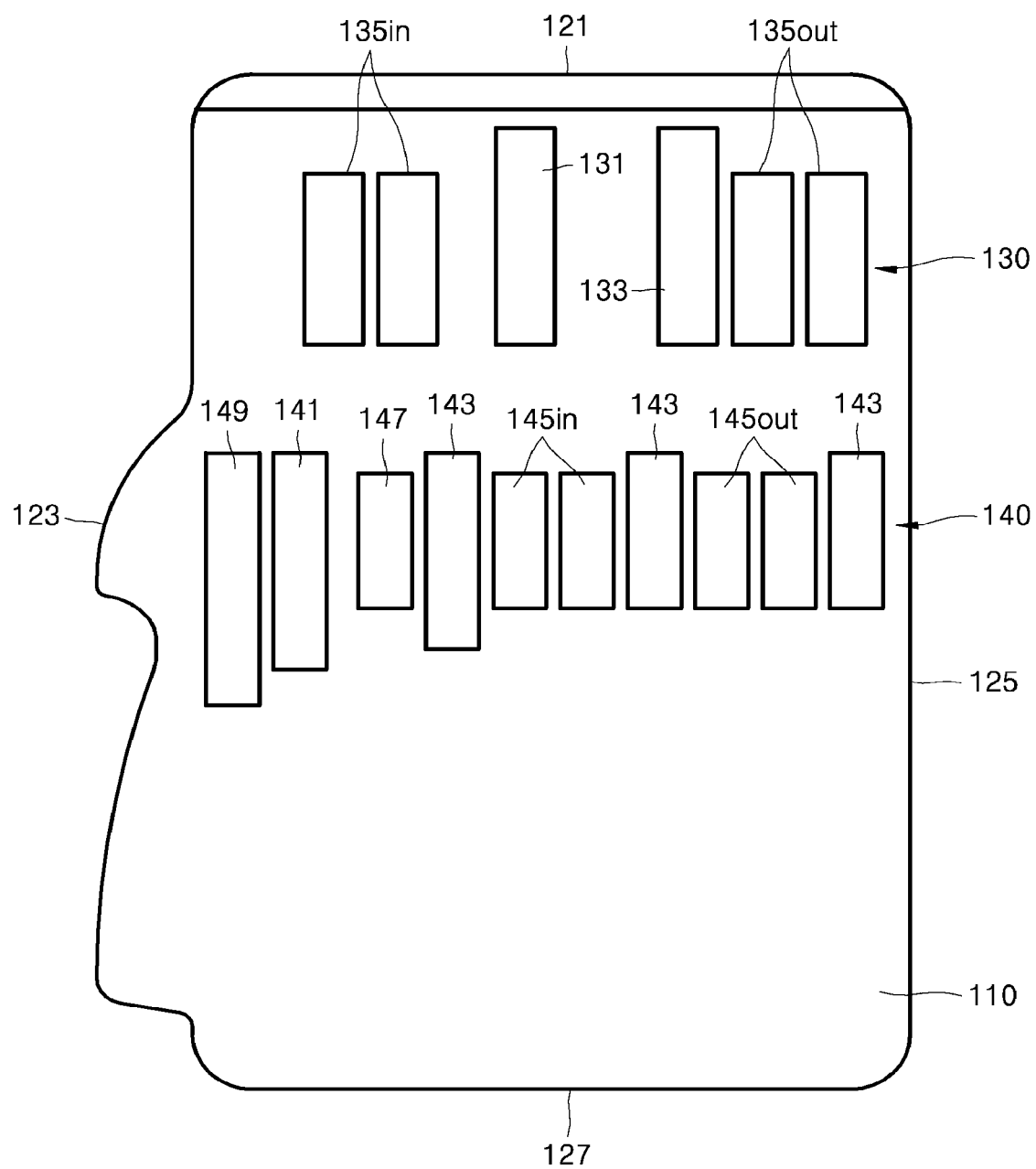

Referring to FIG. 5B, a length of the second voltage power terminal 141 in the first direction may be smaller than a length of the card detection terminal 149 in the first direction. Also, a distance between the edge 121 at the insertion side and the front end of the card detection terminal 149 may be substantially the same as a distance between the edge 121 at the insertion side and the front end of the second voltage power terminal 141.

When the second voltage power terminal 141 and the card detection terminal 149 are configured as illustrated in FIG. 5B, the second voltage power terminal 141 and the card detection terminal 149 may substantially simultaneously contact socket terminals, and the card detection terminal 149 (which is a ground terminal) and the ground terminals 143 included in the second row may substantially simultaneously contact the socket terminals. Mutual interference between terminals due to noise may thereby be minimized. Furthermore, as the rear end of the card detection terminal 149 extends farther than the position of the rear end of the second voltage power terminal 141, overtravel (which refers to deviation of the card detection terminal 149 from a corresponding position of a socket pin) may be further minimized.

Figure 5C:
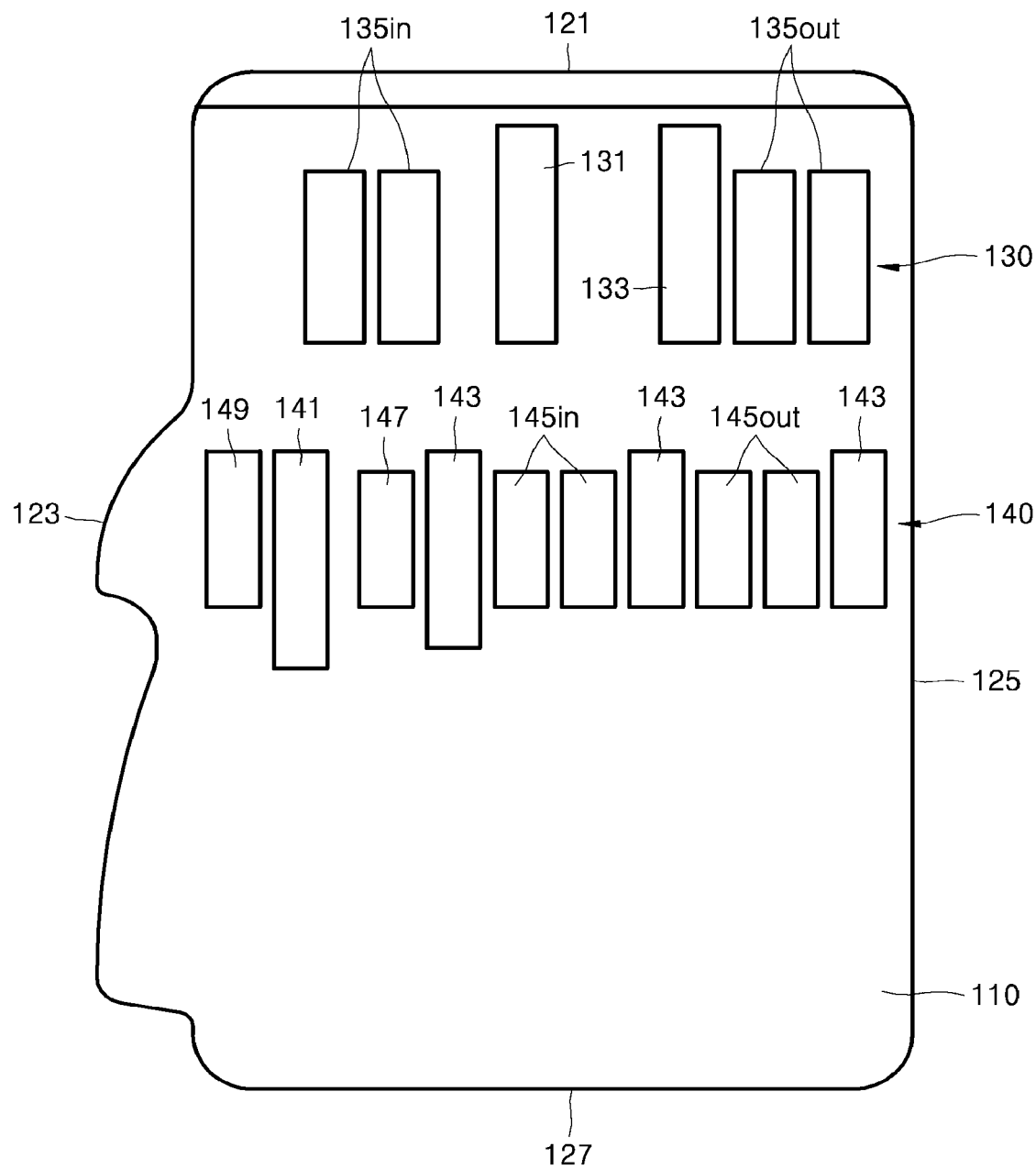

Referring to FIG. 5C, a length of the card detection terminal 149 in the first direction may be shorter than a length of the second voltage power terminal 141. Also, a distance between the edge 121 at the insertion side and the front end of the card detection terminal 149 may be substantially the same as a distance between the edge 121 at the insertion side and the front end of the second voltage power terminal 141.

Also, a distance between the edge 121 at the insertion side and the rear end of the card detection terminal 149 is smaller than a distance between the edge 121 at the insertion side and the rear end of the second voltage power terminal 141.

When the second voltage power terminal 141 and the card detection terminal 149 are configured as illustrated in FIG. 5C, the second voltage power terminal 141 and the card detection terminal 149 may substantially simultaneously contact socket terminals, and the card detection terminal 149 (which is a ground terminal) and the ground terminals 143 included in the second row may substantially simultaneously contact the socket terminals. Mutual interference between terminals due to noise may thereby be minimized.

Figure 5D:
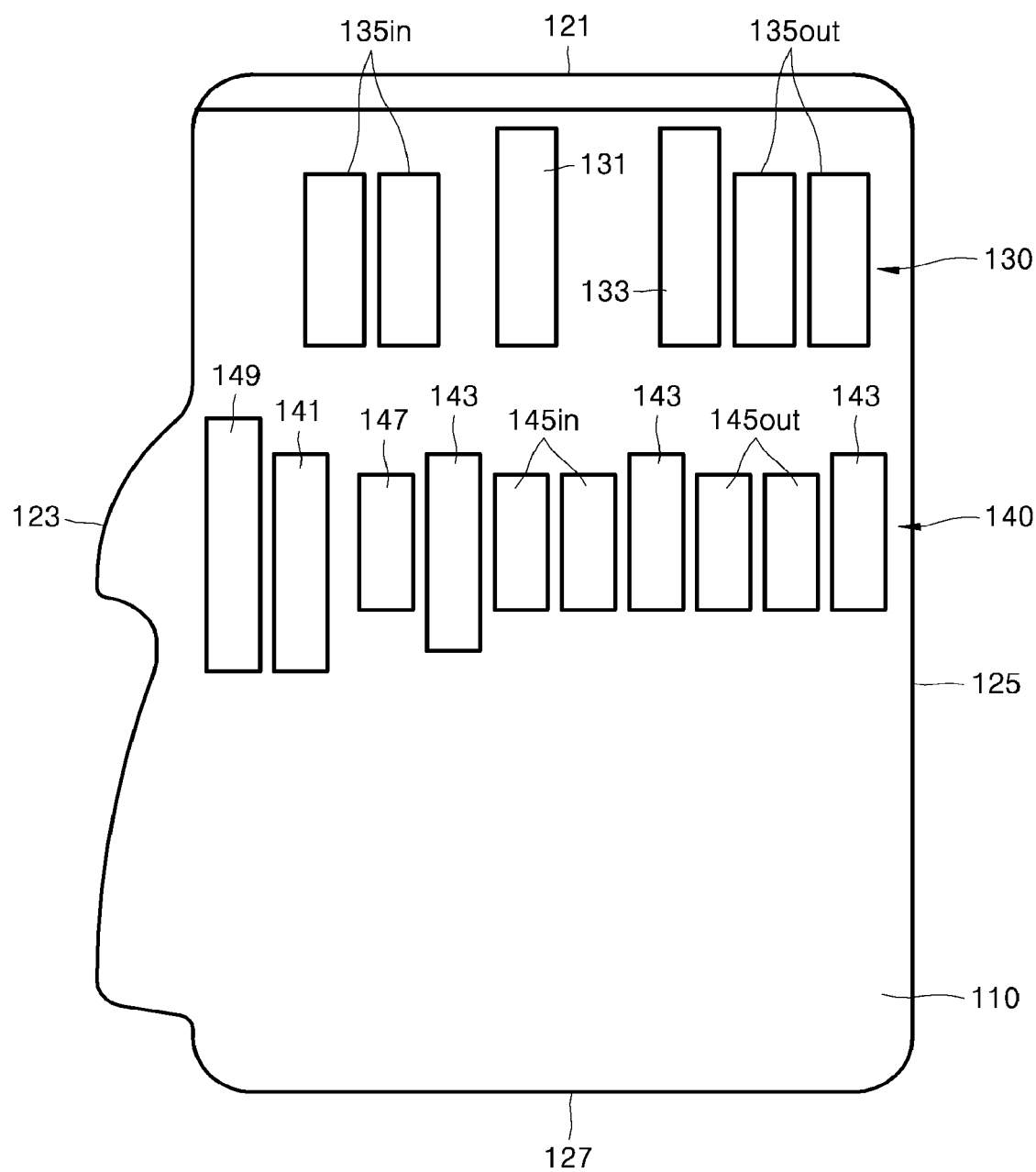

Referring to FIG. 5D, a length of the card detection terminal 149 in the first direction may be longer than a length of the second voltage power terminal 141. Also, a distance between the edge 121 at the insertion side and the front end of the card detection terminal 149 may be smaller than a distance between the edge 121 at the insertion side and the front end of the second voltage power terminal 141.

Also, a distance between the edge 121 at the insertion side and the rear end of the card detection terminal 149 may be substantially the same as a distance between the edge 121 at the insertion side and the rear end of the second voltage power terminal 141.

When the second voltage power terminal 141 and the card detection terminal 149 are configured as illustrated in FIG. 5D, the card detection terminal 149 may contact socket terminals before the card detection terminal 149 does (i.e., preferentially contact socket terminals), so that a host may promptly perform card recognition, thus enabling a quick response of the host.

Furthermore, as the rear end of the card detection terminal 149 is withdrawn to a position of the rear end of the second voltage power terminal 141, overtravel (which refers to deviation of the card detection terminal 149 from a corresponding position of a socket pin) may be minimized.

Figure 5E:
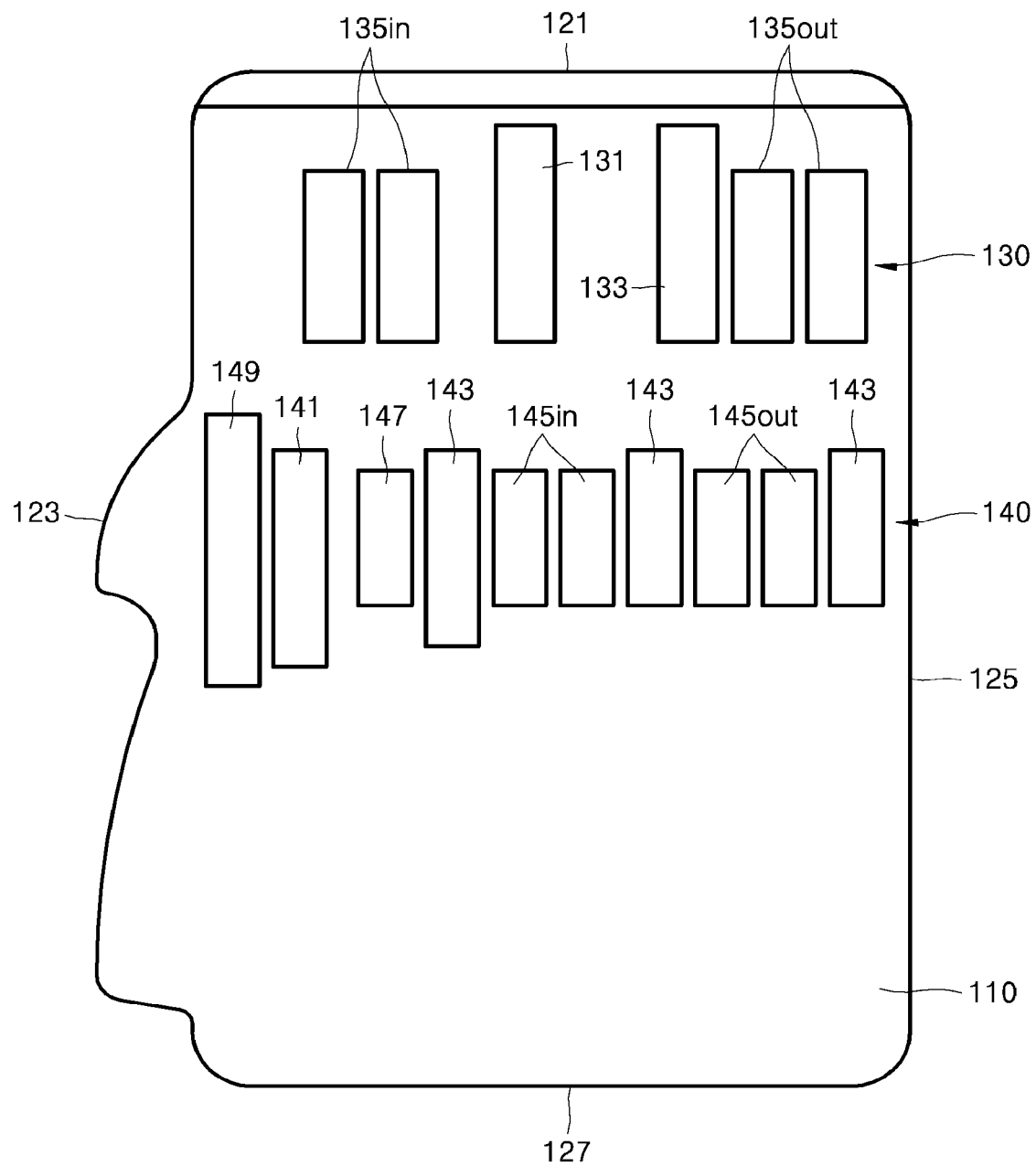

Referring to FIG. 5E, a length of the card detection terminal 149 in the first direction may be longer than a length of the second voltage power terminal 141. Also, a distance between the edge 121 at the insertion side and the front end of the card detection terminal 149 may be smaller than a distance between the edge 121 at the insertion side and the front end of the second voltage power terminal 141.

Also, a distance between the edge 121 at the insertion side and the rear end of the card detection terminal 149 is greater than a distance between the edge 121 at the insertion side and the rear end of the second voltage power terminal 141.

When the second voltage power terminal 141 and the card detection terminal 149 are configured as illustrated in FIG. 5E, the card detection terminal 149 may preferentially contact socket terminals (i.e., before contact with the other terminals) so that a host may promptly perform card recognition, thus enabling a quick response of the host.

Furthermore, as the rear end of the card detection terminal 149 extends farther than the position of the rear end of the second voltage power terminal 141, overtravel (which refers to deviation of the card detection terminal 149 from a corresponding position of a socket pin) may be further minimized.

Figure 6:
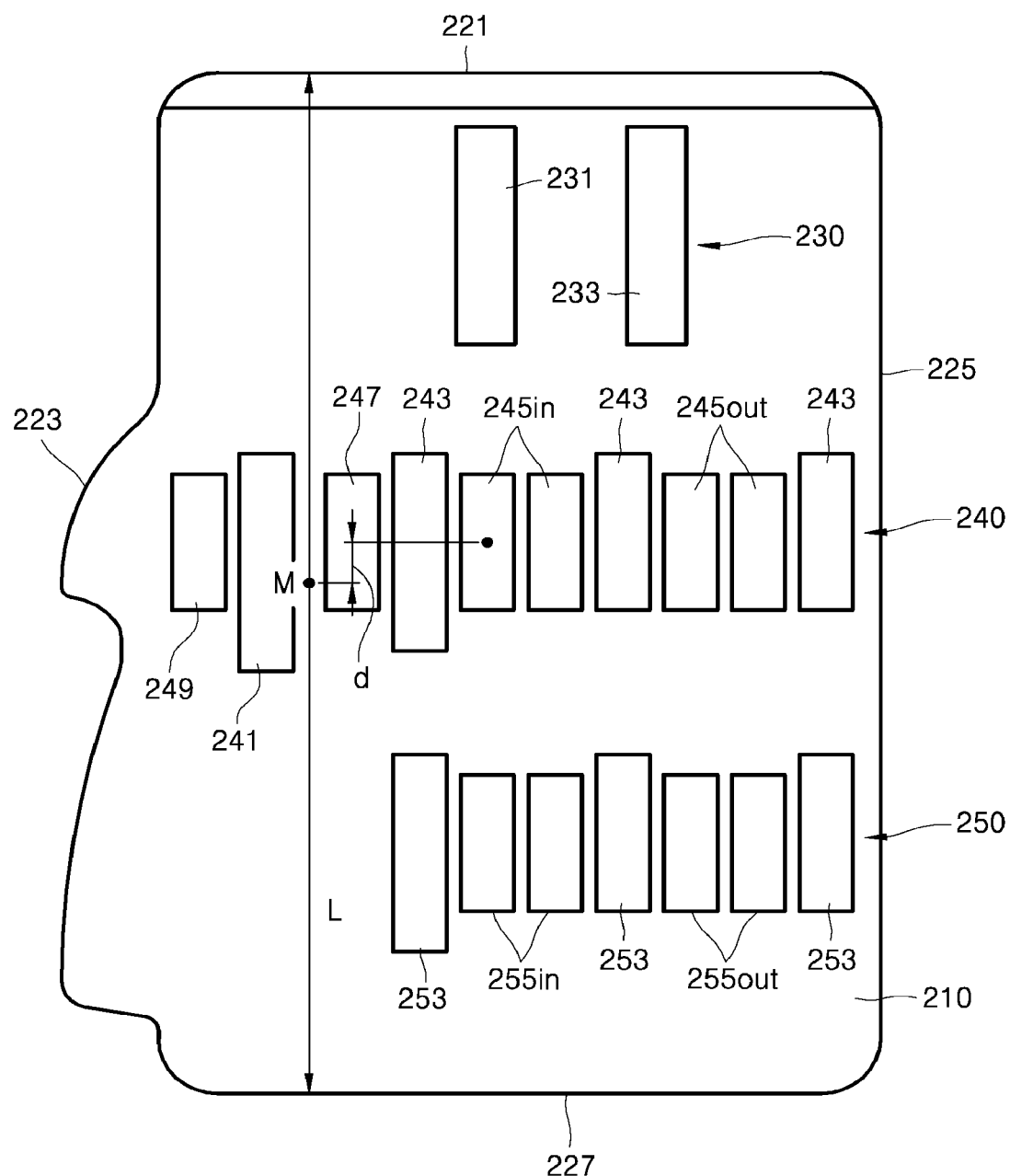
FIG. 6 is a plan view illustrating a memory card according to an exemplary embodiment of the inventive concepts.

FIG. 6 is a plan view illustrating a memory card 200 according to an exemplary embodiment of the inventive concepts.

Referring to FIG. 6, a substrate 210 may include a plurality of first row terminals 230 arranged adjacent to an edge 221 at an insertion side, a plurality of second row terminals 240 that are spaced farther apart from the edge 221 at the insertion side than the first row terminals 230, and a plurality of third row terminals 250 that are spaced farther apart from the edge 221 at the insertion side than the second row terminals 240.

The first row terminals 230 may include a first voltage power terminal 231 and at least one ground terminal 233.

The second row terminals 240 may include a second voltage power terminal 241, first data terminals 245in and 245out, a reference clock terminal 247, a card detection terminal 249, and at least one ground terminal 243. The first data terminals 245in and 245out may include a pair of first data input terminals 245in and a pair of first data output terminals 245out. The card detection terminal 249 may be disposed adjacent to the second voltage power terminal 241 and may be a grounded terminal.

The third row terminals 250 may include second data terminals 255in and 255out and at least one ground terminal 253. The second data terminals 255in and 255out may include a pair of second data input terminals 255in and a pair of second data output terminals 255out.

The first row terminals 230 may include a first voltage power terminal 231 for applying a first voltage that may be, for example, approximately between about 3.0 V and about 3.5 V. The first voltage may be supplied to semiconductor devices among semiconductor devices in the memory card 200 that operate at a low speed. For example, the first voltage may be supplied to a non-volatile memory device in the memory card 200.

The second row terminals 240 may include a second voltage power terminal 241 for applying a second voltage that may be, for example, approximately between about 1.5 V and about 2.2 V. The second voltage may be supplied to semiconductor devices among semiconductor devices in the memory card 200 that operate at a high speed. For example, the second voltage may be supplied to a memory controller 292 in the memory card 200 (see FIG. 7A).

The third row terminals 250 may include a pair of second data input terminals 255in and a pair of second data output terminals 255out. While the second data output terminals 255out are illustrated as being disposed closer to a center of the memory card 200 than the second data input terminals 255in in FIG. 6, positions of the second data input terminals 255in and the second data output terminals 255out may be exchanged and positions of the second data input terminals 255in and the second data output terminals 255out may be varied.

A pair of second data input terminals 255in may have substantially identical dimensions, and a pair of second data output terminals 255out may have substantially identical dimensions. Also, the second data input terminals 255in and the second data output terminals 255out may have substantially identical dimensions.

A length of the second data input terminals 255in and the second data output terminals 255out in the first direction may be shorter than a length of ground terminals 253 included in a third row in the first direction.

Front ends of the ground terminals 253 included in the third row may be closer to the edge 221 at the insertion side than front ends of the second data input terminals 255in and the second data output terminals 255out.

A distance between the rear ends of the ground terminals 253 included in the third row and the edge 221 at the insertion side may be greater than or equal to a distance between the second data input terminals 255in and the second data output terminals 255out and the edge 221 at the insertion side.

Furthermore, a location range in the first direction of the second data input terminals 255in and the second data output terminals 255out may be within a location range in the first direction of the ground terminals 253 included in the third row.

The second row terminals 240 may be disposed in or near a center portion of the memory card 200. A distance between the second row terminals 240 and the memory controller 292 and a distance between the second row terminals 240 and the non-volatile memory device 294 may be reduced, and routing may be simplified. Thus, a high operational speed may be achieved and a circuit design may be more easily configured.

For example, a distance d in a first direction between a center of the second row terminals 240 and a center M of the memory card 200 may be approximately about 20% or less of a length L of the memory card 200 in the first direction. The second row terminals 240 may have various lengths in the first direction, and moreover, positions of the front ends and the rear ends of the respective terminals may not be regular. Here, the center of the second row terminals 240 is defined by a center of a terminal that is closest to the edge 221 at the insertion side, among the first data input terminals 245in and the first data output terminals 245out.

The second data input terminals 255in and the second data output terminals 255out may be spaced apart from each other with a ground terminal included therebetween. The ground terminal may prevent signal noise between the second data input terminals 255in and the second data output terminals 255out.

The second data input terminals 255in may be disposed between a pair of ground terminals so as to be shielded. The second data output terminals 255out may also be disposed between a pair of ground terminals so as to be shielded. The second data input terminals 255in and the second data output terminals 255out may each be shielded by a pair of ground terminals, thereby enabling the stable inputting or outputting of data.

In some embodiments, the second data input terminals 255in and the second data output terminals 255out may be spaced apart from each other with a ground terminal included therebetween, and the second data input terminals 255in and the second data output terminals 255out as a whole may be disposed between a pair of ground terminals. In other words, while the second data input terminals 255in are shielded by a pair of ground terminals and the second data output terminals 255out are shielded by a pair of ground terminals, the second data input terminals 255in and the second data output terminals 255out may have a common ground terminal. However, the second data input terminals 255in and the second data output terminals 255out may also be shielded without a common ground terminal therebetween.

Figure 7A:
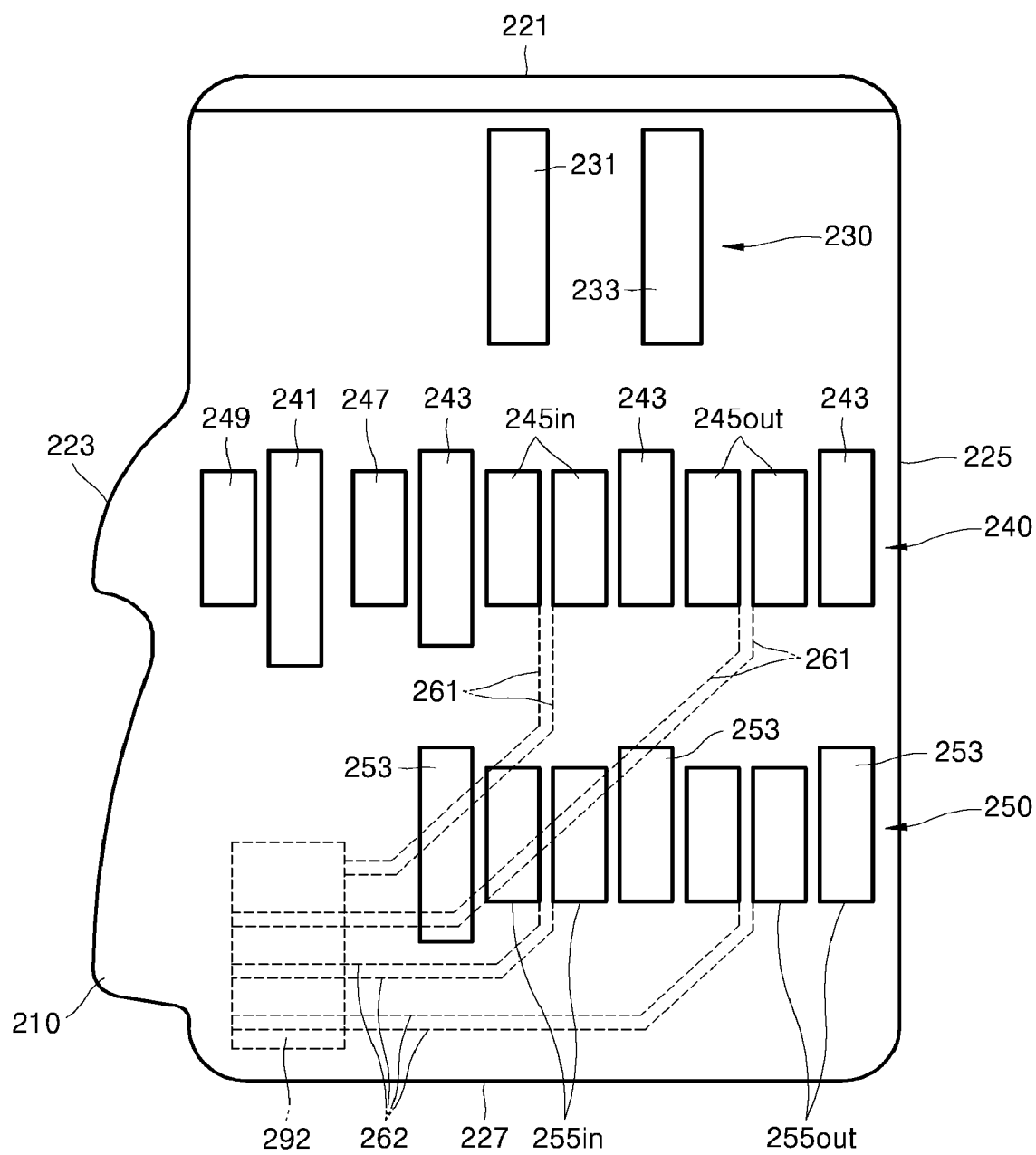
FIGS. 7A and 7B are a partial perspective views illustrating a memory controller in a memory card according to an exemplary embodiment of the inventive concepts.
Figure 7B:
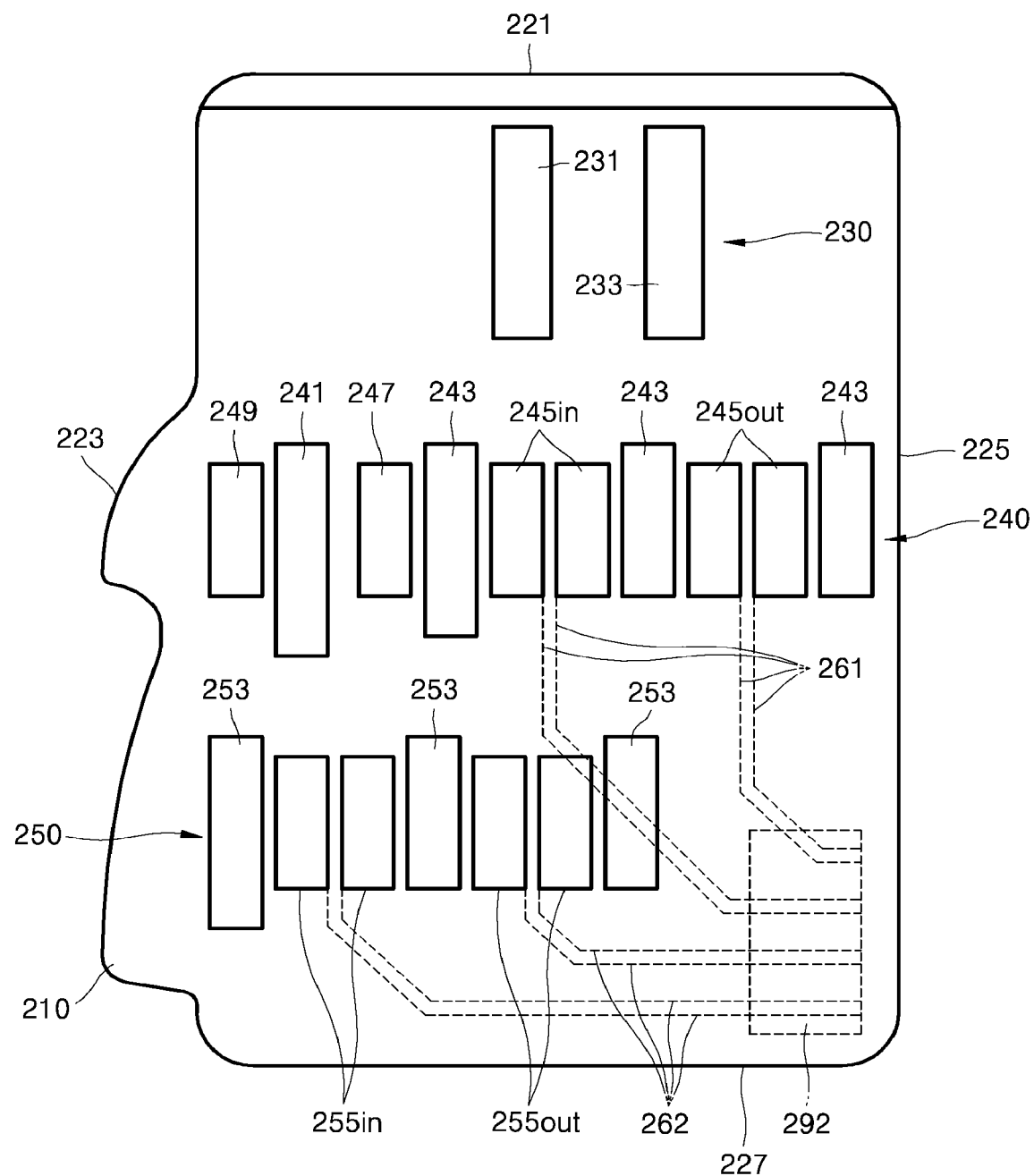

FIGS. 7A and 7B are partial perspective views illustrating the memory controller 292 in the memory card 200 according to an exemplary embodiment of the inventive concepts.

Referring to FIG. 7A, the memory controller 292 is connected to the first data input terminals 245in and the first data output terminals 245out via a first signal path 261 through which data is transmitted and received, and is connected to the second data input terminals 255in and the second data output terminals 255out via a second signal path 262 through which data is transmitted and received.

The memory controller 192 may transmit and receive an electrical signal to and from a host or an external device via the first signal path 261 and the second signal path 262. The first signal path 261 and the second signal path 262 may be formed on a second surface opposite a first surface of the substrate 210 on which the first row terminals 230 are formed.

The third row terminals 250 may be arranged more adjacent to a third edge 227 than the second row terminals 240. In this case, compared to the exemplary embodiment in which data input and output terminals are disposed in the first row as in FIG. 2, a signal transfer path connecting the memory controller 292 and the second data input terminals 255in and the second data output terminals 255out may be reduced.

Referring to FIGS. 7A and 7B, the memory controller 292 may be disposed at various positions in order to reduce lengths of the first signal path 261 and the second signal path 262 or a length difference between the paths. For example, the memory controller 292 may be disposed adjacent to a third edge 227.

Referring to FIG. 7A, the memory controller 292 may be disposed adjacent to a portion where a first edge 223 and the third edge 227 meet. The second data input terminals 255in may be disposed at positions in an extension direction of the first data input terminals 245in which is the first direction, and the second data output terminals 255out may be disposed at positions in an extension direction (i.e., the first direction) of the first data output terminals 245out.

Referring to FIG. 7B, the memory controller 292 may be disposed adjacent to a portion where the second edge 225 and the third edge 227 meet. The second data output terminals 255out may be disposed along a direction which the first data input terminals 245in extend in the first direction, and the second data input terminals 255in may be spaced apart from the second data output terminals 255out with a ground terminal included therebetween.

Figure 8A:
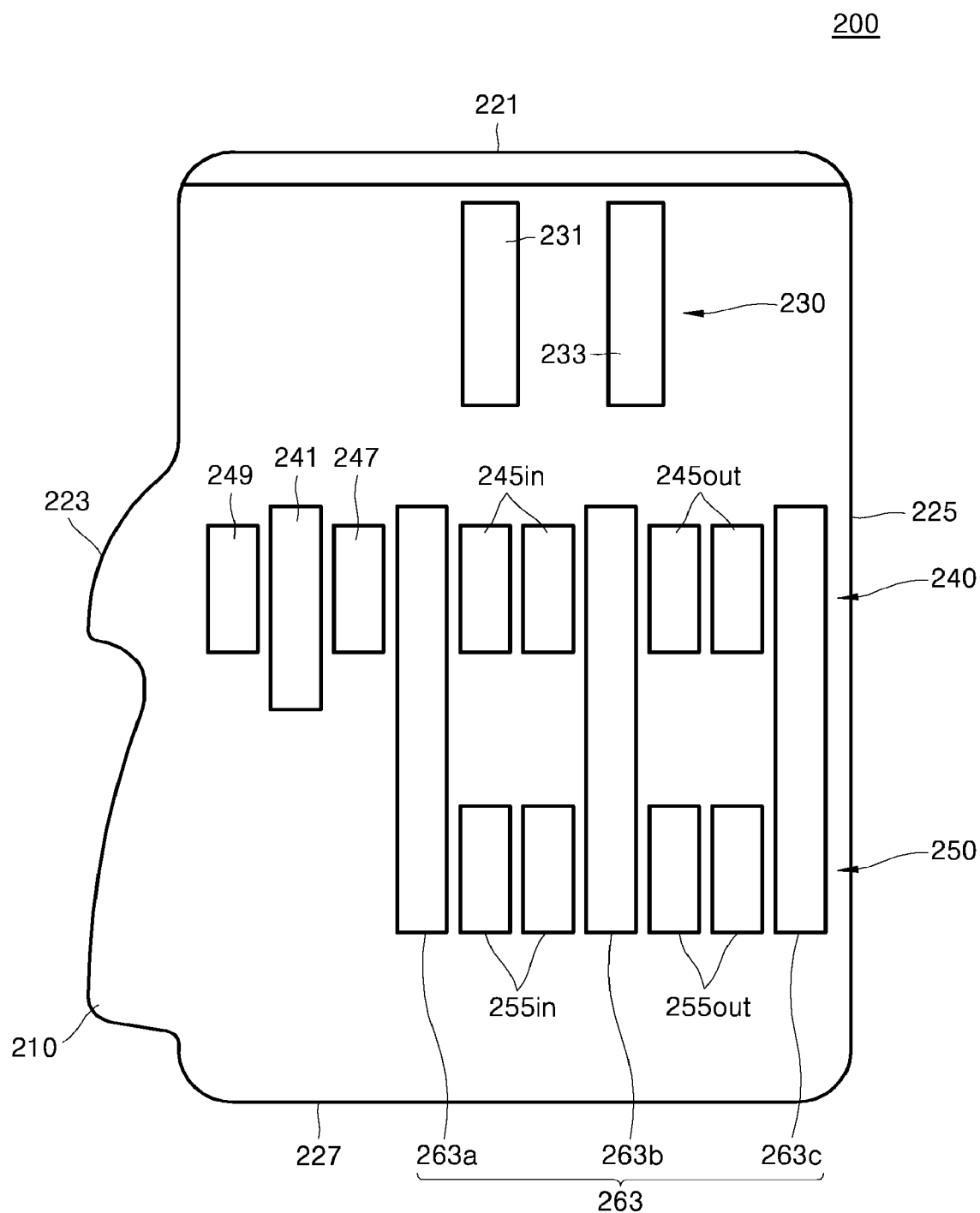
FIGS. 8A and 8B are plan views illustrating a memory card according to an exemplary embodiment of the inventive concepts.
Figure 8B:
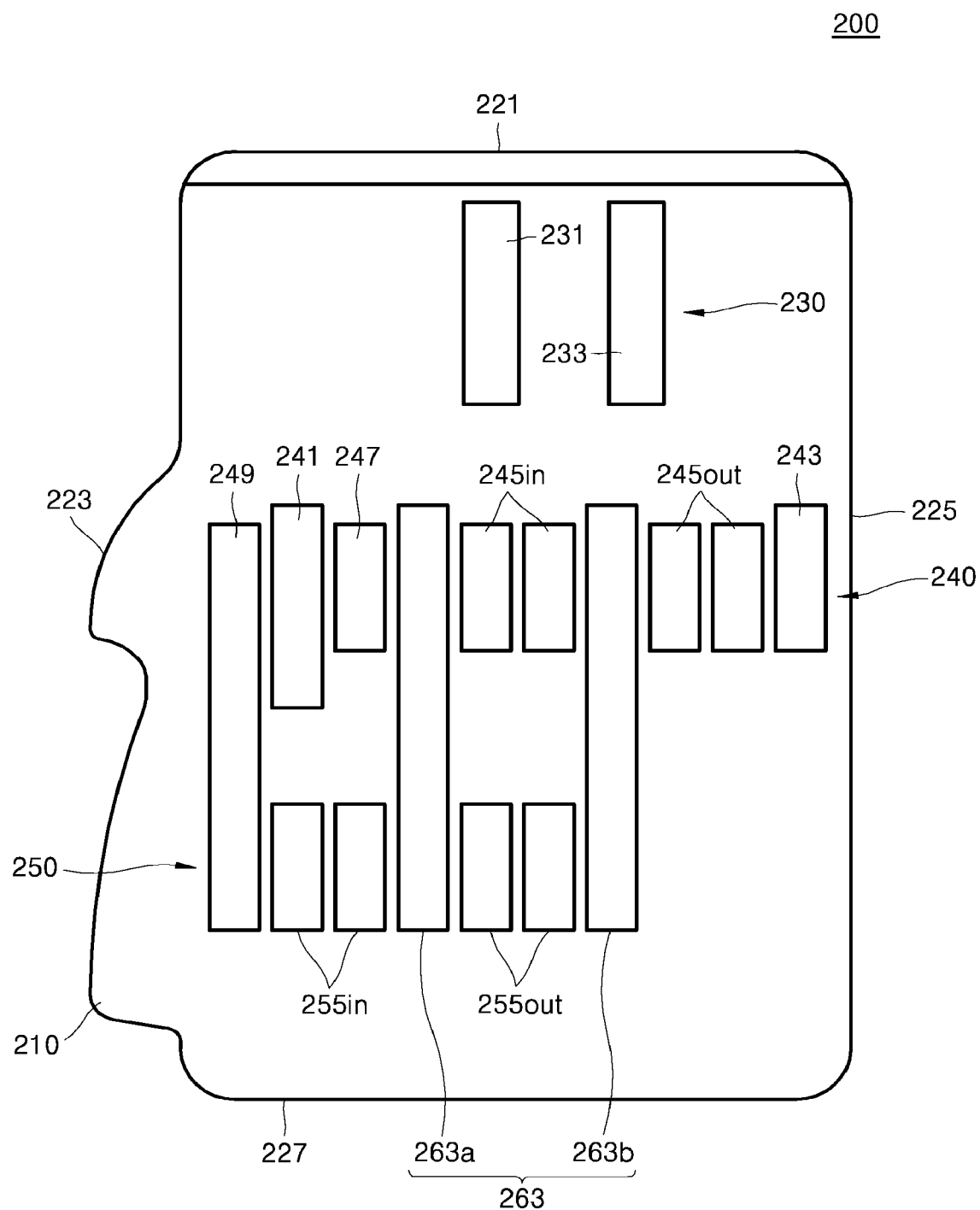

FIGS. 8A and 8B are plan views illustrating a memory card 200 according to an exemplary embodiment of the inventive concepts.

Referring to FIG. 8A, the second row terminals 240 and the third row terminals 250 have common ground terminals 263 (extension ground terminals) extending in the first direction from the second row to the third row. A pair of first data input terminals 245in are disposed between any one pair of the extension ground terminals 263 so as to be shielded, and a pair of first data output terminals 245out may be disposed between any one pair of the extension ground terminals 263 so as to be shielded. Also, a pair of second data input terminals 255in may be disposed between any one pair of the extension ground terminals 263 so as to be shielded, and a pair of second data output terminals 255out may be disposed between any one pair of the extension ground terminals 263 so as to be shielded.

Front ends of the extension ground terminals 263 may be disposed closer to the insertion edge 221 than the front ends of the first data input terminals 245in and the first data output terminals 245out. Also, rear ends of the extension ground terminals 263 may be at approximately the same distance as or farther than rear ends of the second data input terminals 255in and the second data output terminals 255out from the insertion edge 221.

According to an exemplary embodiment, the first data input terminals 245in and the second data input terminals 255in may be all shielded by the same pair of extension ground terminals 263, which are extension ground terminals 263a and 263b, and the first data output terminals 245out and the second data output terminals 255out may be all shielded by the same pair of extension ground terminals 263, which are extension ground terminals 263b and 263c. Although FIG. 8A illustrates the above example only, positions of the second data input terminals 255in and the second data output terminals 255out may be exchanged such that the first data input terminals 245in and the second data output terminals 255out are all shielded by the same pair of extension ground terminals 263, which are the extension ground terminals 263a and 263b, and the first data output terminals 245out and the second data input terminals 255in are all shielded by the same pair of extension ground terminals 263, which are the extension ground terminals 263b and 263c.

Interference between terminals may therefore be prevented by providing the extension ground terminals 263 which extend from the second row to the third row. Also, when the memory card 200 is inserted into a socket, overtravel, which refers to temporary deviation of a pin of the socket corresponding to ground terminals, may be prevented.

Furthermore, with reference to FIG. 6, by using the extension ground terminals 263, when arranging socket pins, the socket pin corresponding to the ground terminals 253 included in the third row may be omitted, and the memory card 200 may be operated using only socket pins corresponding to the ground terminals 243 included in the second row.

Referring to FIG. 8B, the second row 240 and the third row 250 have the extension ground terminals 263 extending from the second row 240 to the third row 250 in the first direction, and the card detection terminal 249 which is a grounded terminal may also extend from the second row 240 to the third row 250 in the first direction. Either the first data input terminals 245in or the first data output terminals 245out may be disposed between the extension ground terminals 263 so as to be shielded, and the other terminals may be disposed between any one extension ground terminal among the extension ground terminals 263 and a nonextended ground terminal, so as to be shielded. Also, either the second data input terminals 255in or the second data output terminals 255out may be disposed between the extension ground terminals 263 so as to be shielded, and the other terminals may be disposed between any one of the extension ground terminals 263 and the card detection terminal 249, so as to be shielded.

According to an exemplary embodiment, the first data input terminals 245in and the second data output terminals 255out may be shielded by a pair of identical extension ground terminals 263, and the second data input terminals 255in may be disposed between one extension ground terminal 263a and the card detection terminal 249 so as to be shielded. Although FIG. 8B illustrates the above example only, the first data input terminals 245in and the first data output terminals 245out may be shielded after exchanging the positions of the first data input terminals 245in and the first data output terminals 245out, and the second data input terminals 255in and the second data output terminals 255out may also be shielded after exchanging the positions of the second data input terminals 255in and the second data output terminals 255out.

By arranging the extension ground terminals 263 extending over the second row and the third row and the card detection terminal 249 (which is a grounded terminal) and extends over the second row and the third row, interference between the terminals may be prevented. In particular, overtravel (which refers to deviation of a position of a pin of a socket corresponding to the ground terminals) may be prevented when the memory card 200 is inserted into a socket, and overtravel of a pin of the socket corresponding to the card detection terminal 249 may be prevented.

Furthermore, with reference to FIG. 6, by using the extension ground terminals 263 and the extending card detection terminal 249, when arranging socket pins, socket pins corresponding to the ground terminals 253 included in the third row may be omitted, and the memory card 200 may be operated using only socket pins corresponding to the ground terminals 243 included in the second row.

FIG. 9A through 9D are plan views illustrating a memory card 300 according to an exemplary embodiment of the inventive concepts.

Figure 9A:
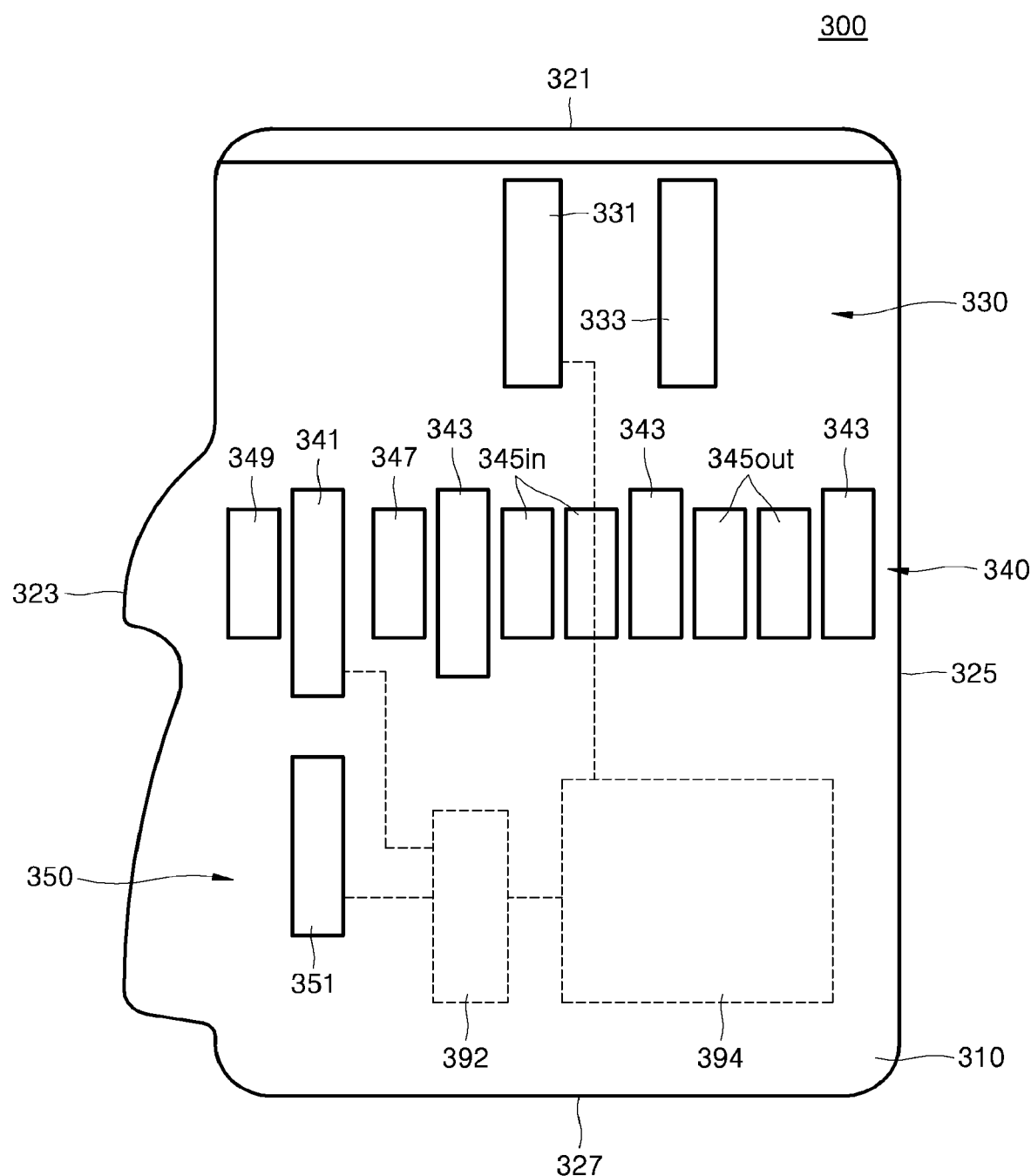
FIG. 9A through 9D are plan views illustrating a memory card according to an exemplary embodiment of the inventive concepts.

Referring to FIG. 9A, the memory card 300 may include a memory controller 392 and a non-volatile memory device 394. While one non-volatile memory device 394 is illustrated in FIG. 9A, at least two non-volatile memory devices 394 may also be mounted.

A substrate 310 may include a plurality of first row terminals 330 disposed adjacent to an edge 321 at an insertion side, a plurality of second row terminals 340 that are spaced farther apart from the edge 321 at the insertion side than the first row terminals 330, and a plurality of third row terminals 350 that are spaced farther apart from the edge 321 at the insertion side than the second row terminals 340.

The first row terminals 330 may include a first voltage power terminal 331 and at least one ground terminal 333.

A first voltage may be, for example, between about 3.0 V and about 3.5 V. The first voltage may be supplied to semiconductor devices that operate at a low speed among semiconductor devices in the memory card 300. For example, the first voltage may be supplied to the non-volatile memory device 394 in the memory card 300.

The second row terminals 340 may include a second voltage power terminal 341, data terminals 345in and 345out, a reference clock terminal 347, a card detection terminal 349, and at least one ground terminal 343. The data terminals 345in and 345out may include a pair of data input terminals 345in and a pair of data output terminals 345out. The card detection terminal 349 may be disposed adjacent to the second voltage power terminal 341 and may be a grounded terminal.

A second voltage may be, for example, between about 1.5 V and about 2.2 V. The second voltage may be supplied to semiconductor devices that operate at a high speed among semiconductor devices in the memory card 300. For example, the second voltage may be supplied to the memory controller 392 in the memory card 300.

The third row terminals 350 may include a third voltage power terminal 351.

A third voltage may be, for example, between about 1.0 V and about 1.5 V. The third voltage may be supplied to semiconductor devices that operate at a high speed among semiconductor devices in the memory card 300. For example, the third voltage may be supplied to the memory controller 392 in the memory card 300.

The memory controller 392 may selectively receive one of the second and third voltages. However, the exemplary embodiments are not limited thereto, and a plurality of memory controllers may be included and the second voltage power terminal 341 and the third voltage power terminal 351 may supply voltages to different memory controllers.

The third voltage power terminal 351 may be spaced apart from the second voltage power terminal 341 in the first direction. The third voltage power terminal 351 does not overlap with positions of the data terminals 345in and 345out extending in the first direction. Accordingly, when the memory card 300 is inserted, a malfunction caused by unnecessary contact between a socket pin corresponding to the data terminals 345in and 345out and the third voltage power terminal 351 may be prevented from occurring.

In order to prevent a malfunction caused by deviation of a socket pin corresponding to the second voltage power terminal 341 from the second voltage power terminal 341 while the data terminals 345in and 345out are connected to a host, a length of the second voltage power terminal 341 in the first direction may be longer than a length of the data terminals 345in and 345out in the first direction. Here, a front end of the second voltage power terminal 341 may be disposed to be closer to the edge 321 at the insertion side than a front end of the data terminals 345in and 345out, and a rear end of the second voltage power terminal 341 may be disposed to be farther from the edge 321 at the insertion side than a rear end of the data terminals 345in and 345out. That is, in regard to the first direction, the data terminals 345in and 345out may be within a range of the second voltage power terminal 341.

In addition, a length of the third voltage power terminal 351 in the first direction may be substantially the same as the length of the second voltage power terminal 341 in the first direction. In other words, the length of the third voltage power terminal 351 in the first direction may be longer than the length of the data terminals 345in and 345out in the first direction. Accordingly, a malfunction caused by deviation of a socket pin corresponding to the third voltage power terminal 351 from the third voltage power terminal 351 may be prevented from occurring.

Figure 9B:
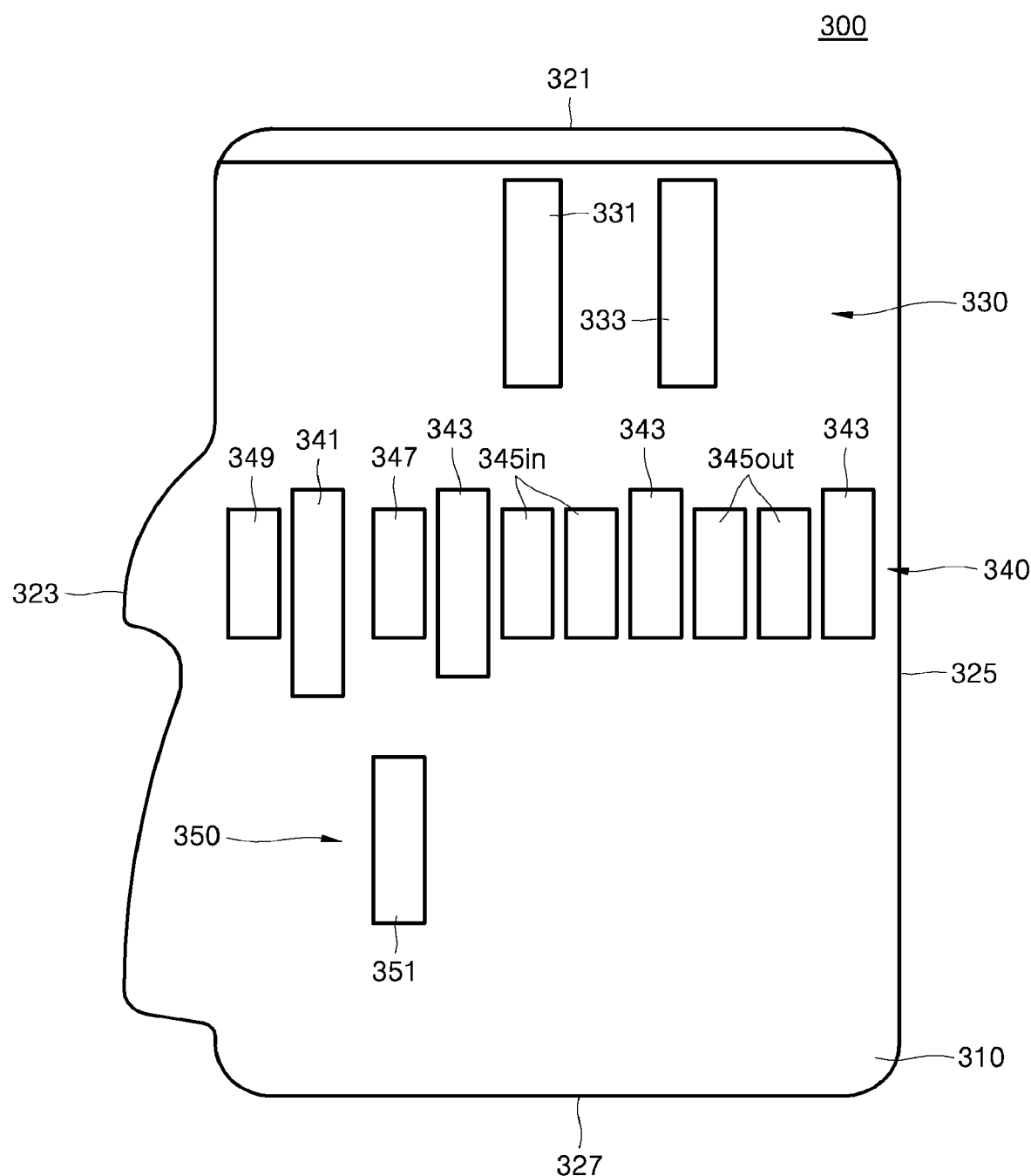

Referring to FIG. 9B, the third voltage power terminal 351 may be spaced apart from the reference clock terminal 347 in the first direction. The third voltage power terminal 351 does not overlap with positions of the data terminals 345in and 345out extending in the first direction. Accordingly, when the memory card 300 is inserted, a malfunction caused by unnecessary contact between a socket pin corresponding to the data terminals 345in and 345out and the third voltage power terminal 351 may be prevented from occurring. In addition, a voltage of about 1.2 V may be applied to the reference clock terminal 347, and thus, the same level of voltage as that of the third voltage power terminal 351 may be applied to the reference clock terminal 347. Thus, when the memory card 300 is completed inserted, a malfunction may be prevented even when a socket pin corresponding to the reference clock terminal 347 contacts the third voltage power terminal 351.

In FIGS. 9A and 9B, the memory controller 392 is connected to the data terminals 345in and 345out via a signal path through which data is transmitted and received. Compared to FIG. 3, the memory card 300 includes the data terminals 345in and 345out only in the second row, and thus, the memory controller 392 may be connected to the data terminals 345in and 345out via a single signal path.

Figure 9C:
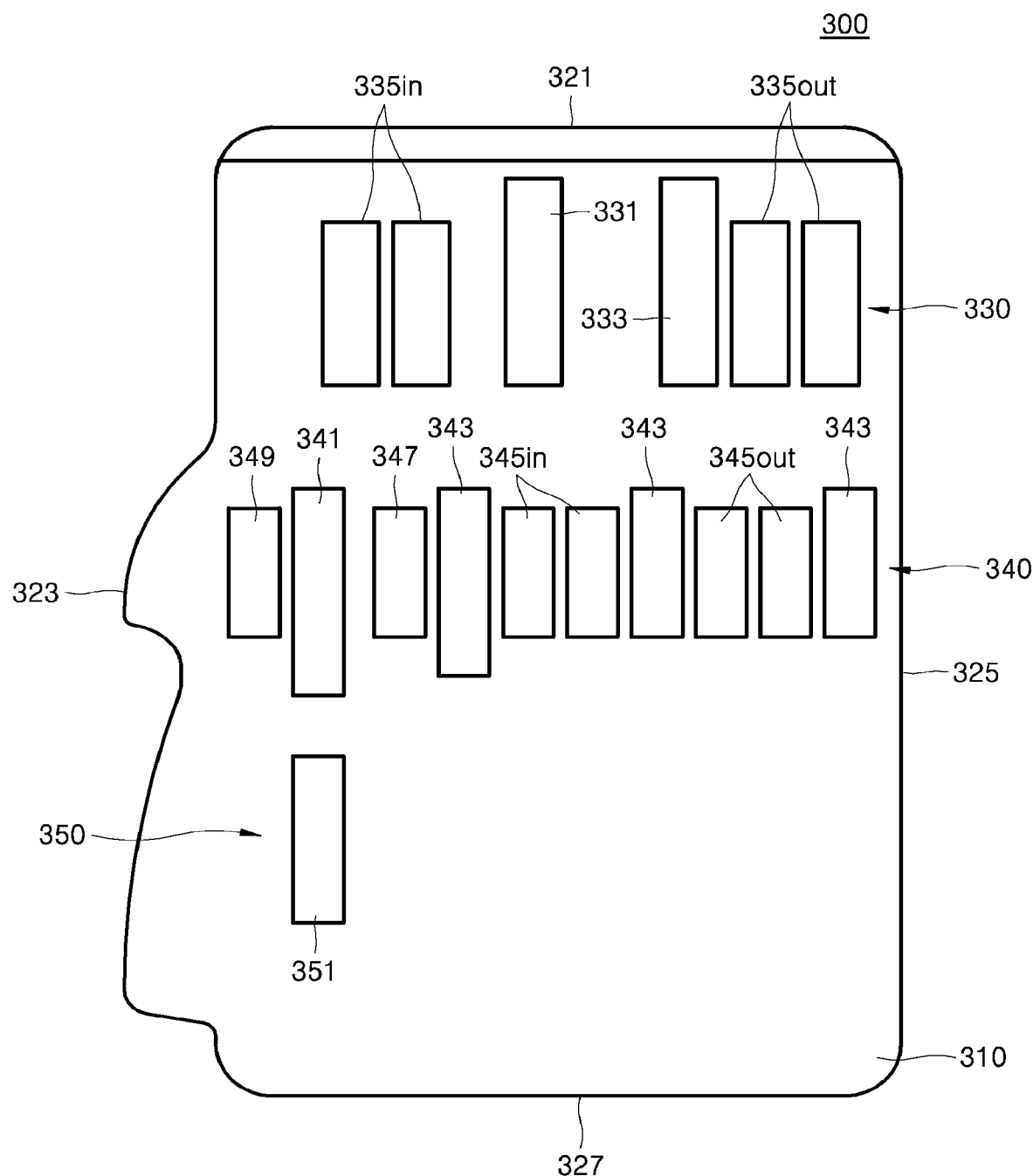

Referring to FIG. 9C, the first row terminals 330 may include first data terminals 335in and 335out, and the second terminals 340 may include second data terminals 345in and 345out. The third voltage power terminal 351 may have a position and a length of the third voltage power terminal 351 described with reference to FIGS. 9A and 9B. While the third voltage power terminal 351 is illustrated as being spaced apart from the second voltage power terminal 341 in the first direction, the third voltage power terminal 351 may be spaced apart also from the reference clock terminal 347 in the first direction. Even when the memory card 300 is completely inserted, there is no need to concern about a contact between the third voltage power terminal 351 and a socket pin corresponding to the first data terminals 335in and 335out. Thus, even when the first data terminals 335in and 335out are disposed at positions in an extension direction of the third voltage power terminal 351 which is the first direction, a malfunction due to unnecessary contact with the socket pin does not occur.

Figure 9D:
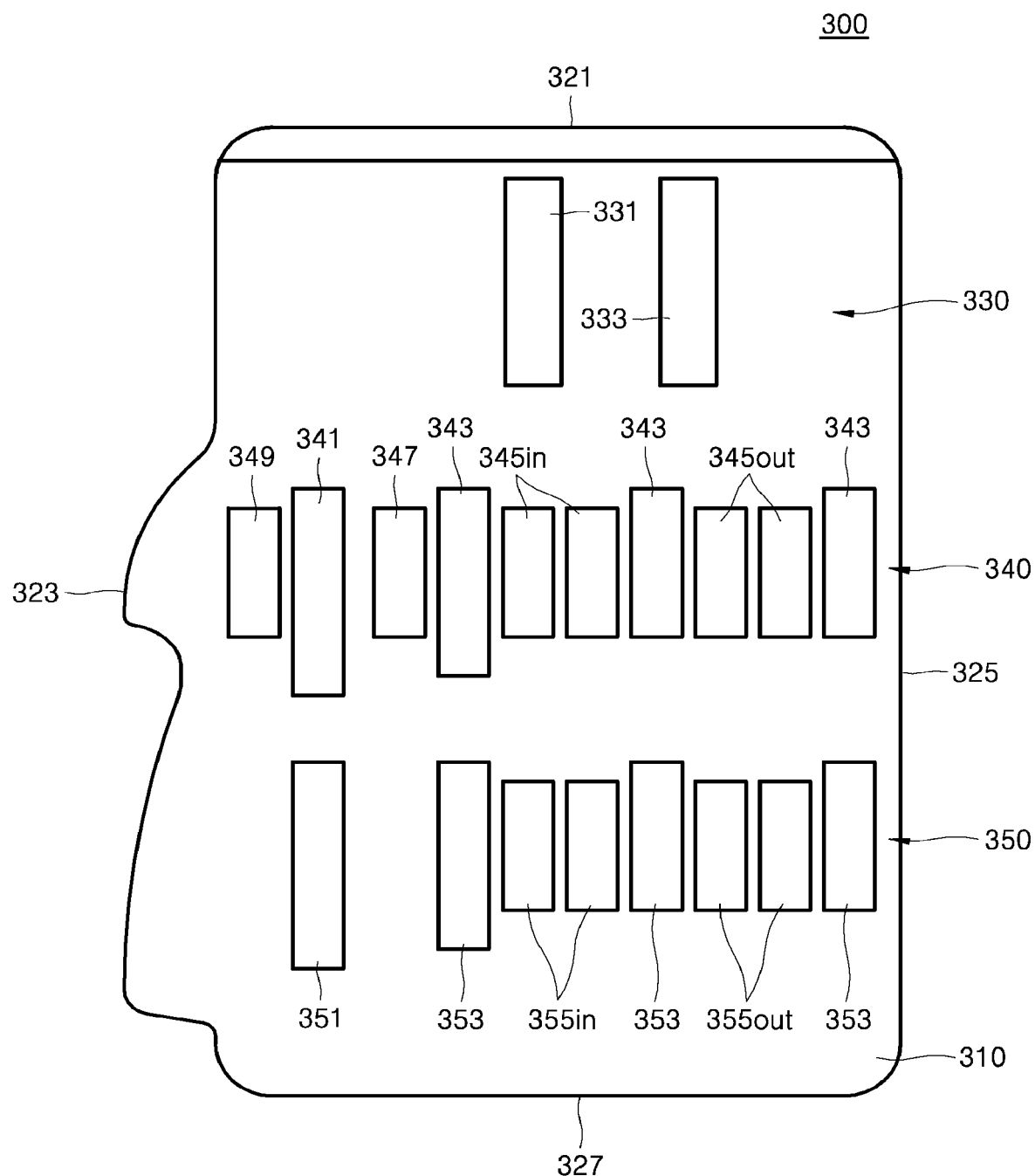

Referring to FIG. 9D, the second row terminals 340 may include first data terminals 345in and 345out, and the third row terminals 350 may include second data terminals 355in and 355out. The third voltage power terminal 351 may have a position and a length of the third voltage power terminal 351 described with reference to FIGS. 9A and 9B. While the third voltage power terminal 351 is illustrated as being spaced apart from the second voltage power terminal 341 in the first direction, the third voltage power terminal 351 may be spaced apart also from the reference clock terminal 347 in the first direction. As the first data terminals 345in and 345out or the second data terminals 355in and 355out are not disposed at positions in an extension direction of the third voltage power terminal 351 which is the first direction, a malfunction due to unnecessary contact with a socket pin is not caused.

In FIGS. 9C and 9D, the memory card 300 includes data terminals in two rows, and the memory controller 392 (see FIG. 9A) may be connected to the data terminals included in the two rows via signal paths.

Figure 10:
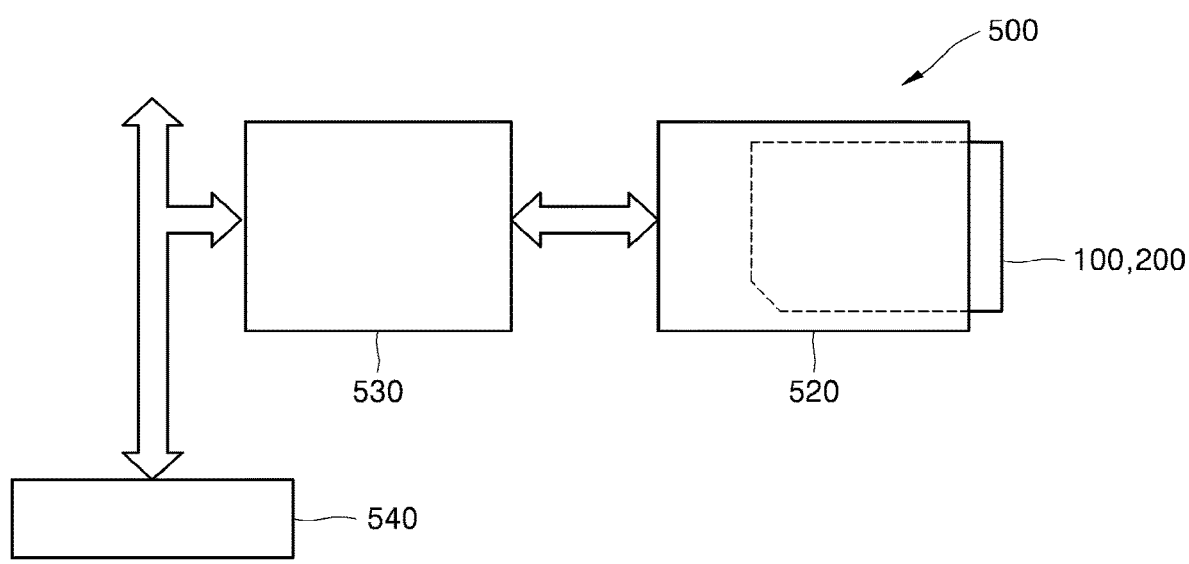
FIG. 10 is a schematic view illustrating a system in which a memory card according to embodiments of the inventive concepts may be used.

FIG. 10 is a schematic view illustrating a system 500 in which the memory card 100 or 200 or 300 according to exemplary embodiments of the inventive concepts.

Referring to FIG. 9, the system 500 includes a socket 520, the memory card 100, 200 or 300 described above with reference to the previous embodiments, a card interface controller 530, and a host 540. The memory card 100 may be insertable into and contact the socket 520. The socket 520 may be configured to be electrically connected to the first row terminals 130, 230, 330 and the second row terminals 140, 240, or 340 of the memory card 100, 200, or 300 or to be electrically connected to the first row terminals 130, 230, or 330, the second row terminals 140, 240, or 340, and the third row terminals 250 or 350 of the memory card 100, 200, or 300. The card interface controller 530 may control data exchange with the memory card 100, 200 or 300 via the socket 520. The card interface controller 530 may also be used to store data in the memory card 100, 200, or 300. The host 540 may control the card interface controller 530.

Figure 11:
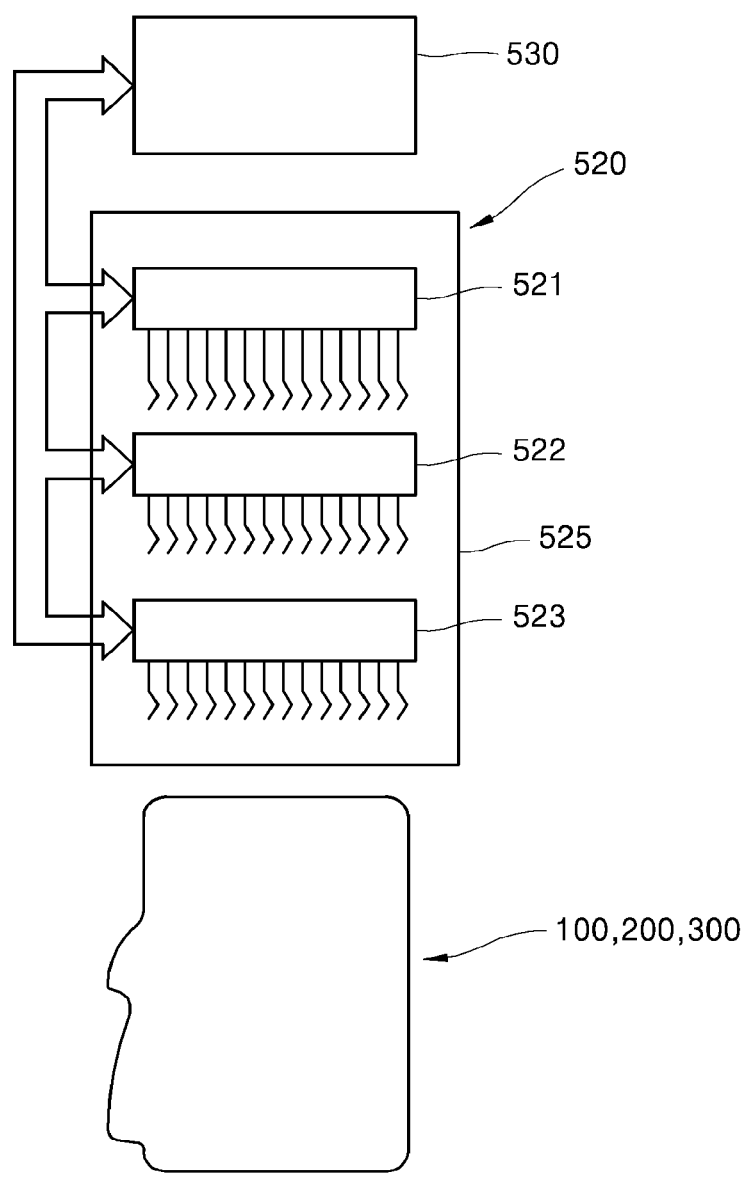
FIG. 11 is a detailed schematic view illustrating a socket of the system of FIG. 10.

FIG. 11 is a detailed schematic view illustrating the socket 520 of FIG. 10.

Referring to FIG. 10, the socket 520, into which the memory card 100, 200 or 300 is insertable, is provided.

The socket 520 may include first row-corresponding socket pin 521 corresponding to the first row terminals 130, 230, or 330 of the memory card 100, 200 or 300, second row-corresponding socket pins 522 corresponding to the second row terminals 140, 240, or 2340 of the memory card 100 or 200, and third row-corresponding socket pins 523 corresponding to the third row terminals 250 of the memory card 200. The socket 520 accommodating the memory card 100 which does not include third row terminals may not include the third row-corresponding socket pins 523. Also, the socket 520 may include a housing 525 that may accommodate the first row-corresponding socket pins 521, the second-row corresponding socket pins 522, and the third-row corresponding socket pins 523.

The memory card 100, 200 or 300 may operate by being inserted into the housing 525 to contact the first row-corresponding socket pins 521, the second-row corresponding socket pins 522, and the third-row corresponding socket pins 523.

As described with reference to FIG. 10, the socket 520 may be electrically connected to the card interface controller 530 which inputs or outputs power, a signal, and/or data to the first row-corresponding socket pins 521, the second-row corresponding socket pins 522, and the third-row corresponding socket pins 523.

A socket pin may exist among the first row-corresponding socket pins 521, the second-row corresponding socket pins 522, and the third-row corresponding socket pins 523, which is configured to recognize the inserted memory card 100, 200 or 300 as a first type card if a predetermined terminal corresponding to the inserted memory card 100, 200 or 300 is a ground terminal, and to recognize the inserted memory card 100, 200 or 300 as a second type card if a predetermined terminal is not a ground terminal.

Figure 12:
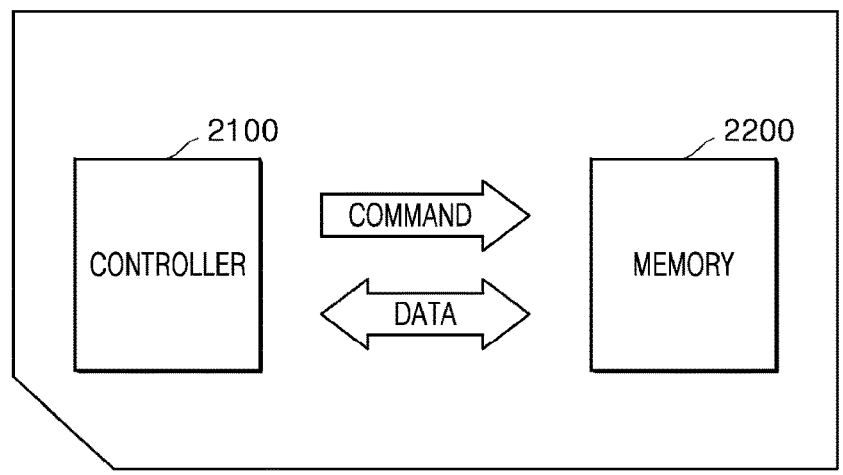
FIG. 12 is a schematic view illustrating a structure of a memory card according to the inventive concepts.

FIG. 12 is a schematic view illustrating a structure of a memory card 2000 according to the inventive concepts.

In detail, a controller 2100 and a memory 2200 may be configured in the memory card 2000 so as to exchange an electrical signal. For example, if the controller 2100 gives a command, the memory 2200 may transmit data. The memory card 2000 may be the memory cards described above.

Figure 13:
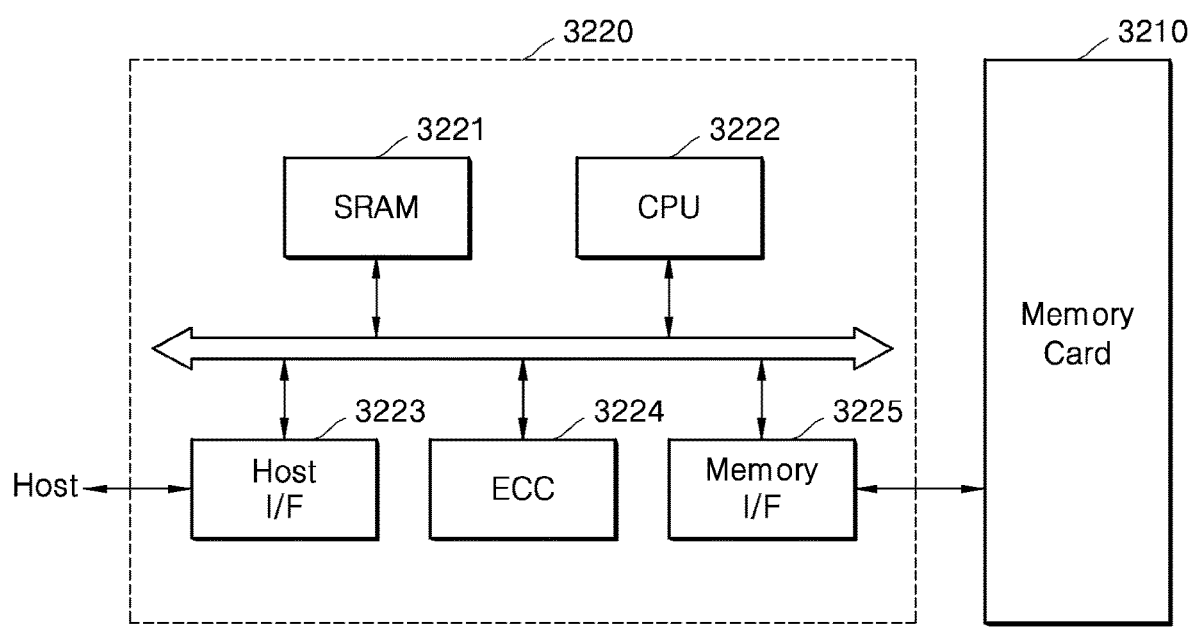
FIG. 13 is a block diagram illustrating a memory device including a memory card according to the inventive concepts.

FIG. 13 is a block diagram illustrating a memory device 3200 including a memory card according to the inventive concepts.

Referring to FIG. 13, the memory device 3200 according to an exemplary embodiment of the inventive concepts includes a memory card 3210. The memory card 3210 may include at least one of the memory cards of the above-described embodiments. Also, the memory card 3210 may further include a semiconductor memory device in another form (for example, a non-volatile memory device and/or a static random access memory (SRAM) device). The memory device 3200 may include a memory controller 3220 that controls data exchange between a host and the memory card 3210.

The memory controller 3220 may include a processing unit 3222 that controls an overall operation of the memory device 3200. Also, the memory controller 3220 may include an SRAM 3221 that is used as an operation memory of the processing unit 3222. In addition, the memory controller 3220 may further include a host interface 3223 and a memory interface 3225. The host interface 3223 may include a data exchange protocol between the memory device 3200 and the host. The memory interface 3225 may connect the memory controller 3220 and the memory card 3210. Furthermore, the memory controller 3220 may further include an error correction code (ECC) block 3224. The ECC block 3224 may detect and correct an error of data read from the memory card 3210. Although not illustrated, the memory device 3200 may further include a read only memory (ROM) device that stores code data for interfacing with the host. The memory device 3200 may also be implemented by using a solid state drive (SSD) which may replace a hard disk of a computer system.

Figure 14:
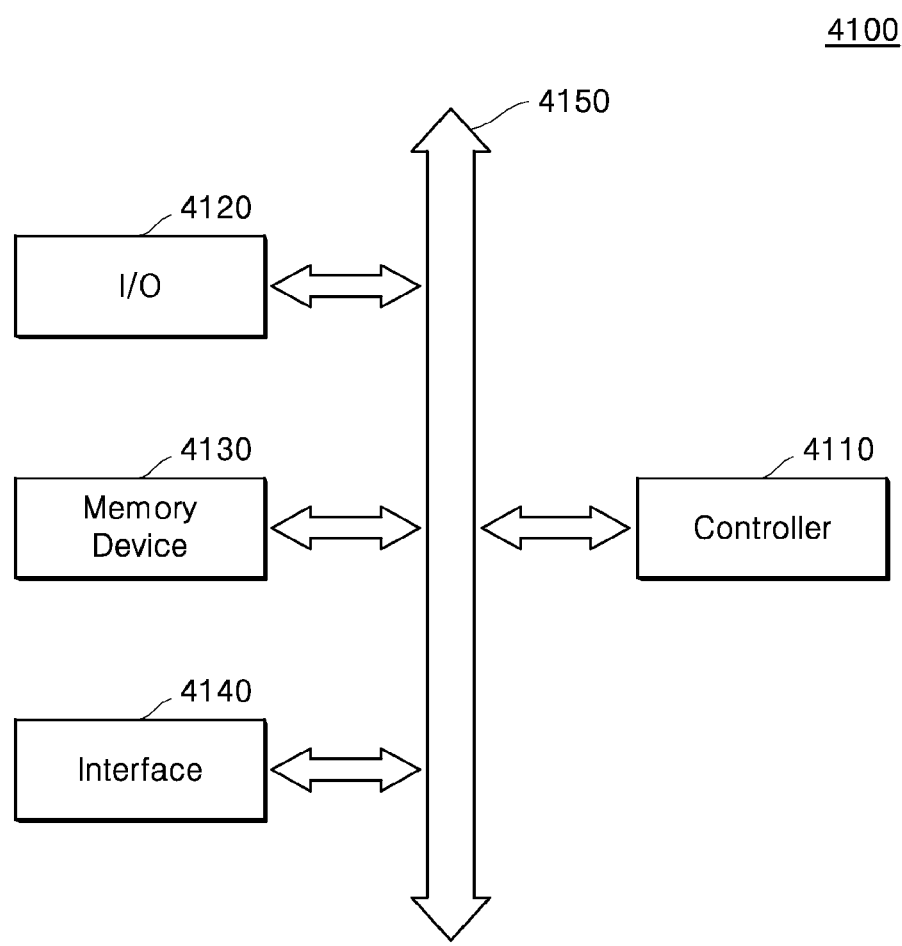
FIG. 14 is a block diagram illustrating an electronic system including a memory card according to the inventive concepts.

FIG. 14 is a block diagram illustrating an electronic system 4100 including a memory card according to the inventive concepts.

Referring to FIG. 14, the electronic system 4100 may include a controller 4110, an input/output (I/O) device 4120, a memory device 4130, an interface 4140, and a bus 4150. The controller 4110, the input/output device 4120, the memory device 4130, and/or the interface 4140 may be coupled to one another via the bus 4150. The bus 4150 corresponds to a path through which data is transmitted.

The controller 4110 may include at least one of a microprocessor, a digital signal processor, a microcontroller, and logic devices that may perform these similar functions. The input/output device 4120 may include a keypad, a keyboard, a display device or the like. The memory device 4130 may store data and/or commands. The memory device 4130 may include at least one of the memory cards described in the above embodiments. Also, the memory device 4130 may further include a semiconductor memory device in another form (for example, a non-volatile memory device and/or an SRAM device). Data may be transmitted to or received from a communication network via the interface 4140. The interface 4140 may be in a wired or wireless form. For example, the interface 4140 may include an antenna or a wired/wireless transceiver. Although not illustrated, the electronic system 4100 may further include, as an operation memory device to improve an operation of the controller 4110, a high-speed dynamic random access memory (DRAM) device and/or an SRAM device.

The electronic system 4100 may be applied to a personal digital assistant (PDA), a portable computer, a web tablet, a wireless phone, a mobile phone, a digital music player, or any electronic products that transmit and/or receive information in a wireless environment.

Figure 15:
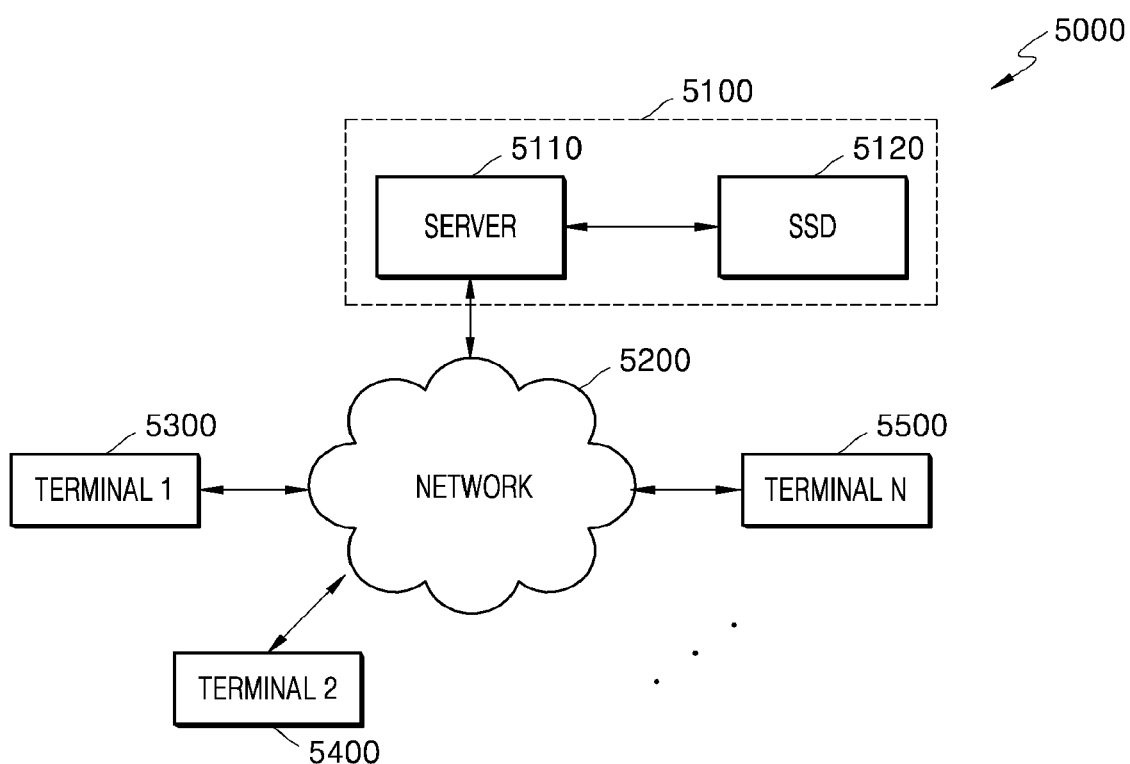
FIG. 15 is a block diagram illustrating an implementation example of a network for a server system that includes an electronic device according to an exemplary embodiment of the inventive concepts.

FIG. 15 is a block diagram illustrating an implementation example of a network 5200 for a server system 5100 that includes an electronic device according to an exemplary embodiment of the inventive concepts.

Referring to FIG. 15, a network system 5000 according to an exemplary embodiment of the inventive concepts may include a server system 5100 and multiple terminals 5300, 5400, and 5500 that are connected via the network 5200. The server system 5100 according to the present exemplary embodiment may include a server 5110 that processes requests received from the terminals 5300, 5400, and 5500 connected to the network 5200 and an electronic device 5120 that stores data corresponding to the requests received from the terminals 5300, 5400, and 5500. The electronic device 5120 may include, for example, at least one of the memory cards according to the exemplary embodiments. The electronic device 5120 may be, for example, an SSD.

Meanwhile, the electronic device 5120 according to the inventive concepts described above may be mounted using various types of packages. For example, the electronic device 5120 according to the inventive concepts may be mounted using packages such as a package on package (POP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flat pack (TQFP), a system in package (SIP), a multi-chip package (MCP), a wafer-level fabricated package (WFP), or a wafer-level processed stack package (WSP).

While the inventive concepts has been particularly shown and described with reference to exemplary embodiments thereof, it will be understood that various changes in form and details may be made therein without departing from the spirit and scope of the following claims.

What is claimed is:

1. A memory card comprising:
    a substrate having a first pair of edges and a second pair of edges in which edges of each pair are arranged opposite to each other, at least one of the edges being an insertion edge of the memory card;
    a memory device and a memory controller in the substrate;
    a plurality of first row terminals disposed on the substrate and arranged adjacent to the insertion edge;
    a plurality of second row terminals spaced apart from the plurality of first row terminals and located farther from the insertion edge than the plurality of first row terminals, the plurality of second row terminals including a first voltage power terminal for applying a first voltage to the memory controller, a pair of first data input terminals electrically connected to the memory controller via a first input signal path, and a pair of first data output terminals electrically connected to the memory controller via a first output signal path; and
    a plurality of third row terminals spaced apart from the plurality of second row terminals and located farther from the insertion edge than the plurality of second row terminals, the plurality of third row terminals comprising a second voltage power terminal for applying a second voltage to the memory controller, a pair of second data input terminals electrically connected to the memory controller via a second input signal path, and a pair of second data output terminals electrically connected to the memory controller via a second output signal path;
    wherein the first voltage and the second voltage are different from each other.

2. The memory card of claim 1, wherein the first voltage is higher than the second voltage.

3. The memory card of claim 1, wherein the plurality of first row terminals further comprise a first ground terminal disposed between the pair of first data input terminals and the pair of first data output terminals.

4. The memory card of claim 3, wherein a length of the first ground terminal in a first direction that is substantially perpendicular to the insertion edge is greater than a length of the pair of first data input terminals in the first direction and a length of the pair of first data output terminals in the first direction.

5. The memory card of claim 1, wherein the plurality of second row terminals further include a card detection terminal which is grounded terminal.

6. The memory card of claim 5, wherein a distance between a front end of the card detection terminal and the insertion edge in a first direction that is substantially perpendicular to the insertion edge is equal to or less than a distance between a front end of the first voltage power terminal and the insertion edge in the first direction.

7. The memory card of claim 5, wherein a length of the card detection terminal in a first direction that is substantially perpendicular to the insertion edge is equal to or greater than a length of the first voltage power terminal in the first direction.

8. The memory card of claim 1, wherein the plurality of second row terminals further comprise a reference clock terminal and a first ground terminal, and the reference clock terminal is disposed between the first voltage power terminal and the first ground terminal.

9. The memory card of claim 1, wherein the plurality of second row terminals further comprise a second ground terminal disposed between the pair of second data input terminals and the pair of second data output terminals.

10. The memory card of claim 1, wherein the pair of first data input terminals are spaced apart from the pair of second data input terminals in a first direction that is substantially perpendicular to the insertion edge, and the pair of first data output terminals are spaced apart from the pair of second data output terminals in the first direction.

11. The memory card of claim 1, wherein the second voltage power terminal is spaced apart from the first voltage power terminal in a first direction that is substantially perpendicular to the insertion edge.

12. A memory card comprising:
a substrate having a first pair of edges and a second pair of edges in which edges of each pair are arranged opposite to each other, at least one of the edges being an insertion edge of the memory card;
a memory device and a memory controller in the substrate;
a plurality of first row terminals disposed on the substrate and arranged adjacent to the insertion edge;
a plurality of second row terminals spaced apart from the plurality of first row terminals and located farther from the insertion edge than the plurality of first row terminals, the plurality of second row terminals including a first voltage power terminal for applying a first voltage to the memory controller, first ground terminals, a pair of first data input terminals electrically connected to the memory controller via a first input signal path, a pair of first data output terminals electrically connected to the memory controller via a first output signal path, a card detection terminal, and a reference clock terminal; and
a plurality of third row terminals spaced apart from the plurality of second row terminals and located farther from the insertion edge than the plurality of second row terminals, the plurality of third row terminals comprising a second voltage power terminal for applying a second voltage to the memory controller, second ground terminals, a pair of second data input terminals electrically connected to the memory controller via a second input signal path, and a pair of second data output terminals electrically connected to the memory controller via a second output signal path;

wherein the first voltage is higher than the second voltage.

13. The memory card of claim 12, wherein the first voltage is between about 1.5 V and about 2.2 V, and the second voltage is between about 1.0 V and about 1.5 V.

14. The memory card of claim 12, wherein the card detection terminal, the first voltage power terminal, the reference clock terminal, the pair of first data input terminals and the pair of first data output terminals are sequentially disposed in a direction substantially parallel to the insertion edge.

15. The memory card of claim 12, wherein the pair of first data input terminals are shielded by a pair of first ground terminals, and the pair of first data output terminals are shielded by a pair of first ground terminals.

16. The memory card of claim 12, wherein the card detection terminal is a grounded terminal, and no terminal is disposed between a front end of the card detection terminal and the insertion edge.

17. The memory card of claim 12, wherein the second voltage power terminal, the pair of second data input terminals and the pair of second data output terminals are sequentially disposed in a direction substantially parallel to the insertion edge.

18. The memory card of claim 12, wherein the pair of second data input terminals are shielded by a pair of second ground terminals, and the pair of second data output terminals are shielded by a pair of second ground terminals.

19. The memory card of claim 12, wherein the second voltage power terminal is spaced apart from the reference clock terminal in a first direction that is substantially perpendicular to the insertion edge.

20. The memory card of claim 12, wherein the plurality of second row terminals are arranged on or adjacent to a hypothetical middle axis of the memory card, and the hypothetical middle axis is substantially parallel to the insertion edge and passes through a center of the memory card.

* * * * *